US011107901B2

(12) United States Patent
Lien et al.

(10) Patent No.: US 11,107,901 B2
(45) Date of Patent: Aug. 31, 2021

(54) CHARGE STORAGE MEMORY DEVICE INCLUDING FERROELECTRIC LAYER BETWEEN CONTROL GATE ELECTRODE LAYERS AND METHODS OF MAKING THE SAME

(71) Applicant: SANDISK TECHNOLOGIES LLC, Addison, TX (US)

(72) Inventors: Yu-Chung Lien, San José, CA (US); Jiahui Yuan, Fremont, CA (US); Deepanshu Dutta, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 9 days.

(21) Appl. No.: 16/374,330

(22) Filed: Apr. 3, 2019

(65) Prior Publication Data

US 2020/0321444 A1 Oct. 8, 2020

(51) Int. Cl.
| | |
|---|---|
| *H01L 29/51* | (2006.01) |
| *H01L 27/11524* | (2017.01) |
| *H01L 27/11556* | (2017.01) |
| *H01L 27/1157* | (2017.01) |
| *H01L 27/11582* | (2017.01) |
| *H01L 29/423* | (2006.01) |
| *H01L 21/28* | (2006.01) |

(52) U.S. Cl.
CPC ........ *H01L 29/516* (2013.01); *H01L 27/1157* (2013.01); *H01L 27/11524* (2013.01); *H01L 27/11556* (2013.01); *H01L 27/11582* (2013.01); *H01L 29/40111* (2019.08); *H01L 29/4234* (2013.01); *H01L 29/42324* (2013.01)

(58) Field of Classification Search
CPC ............ H01L 29/516; H01L 29/40111; H01L 27/11556; H01L 29/42324; H01L 29/66825
See application file for complete search history.

(56) References Cited

U.S. PATENT DOCUMENTS

| | | |
|---|---|---|
| 5,541,871 A | 7/1996 | Nishimura et al. |
| 5,856,688 A | 1/1999 | Lee et al. |
| 5,877,977 A | 3/1999 | Essaian |
| 5,915,167 A | 6/1999 | Leedy |

(Continued)

FOREIGN PATENT DOCUMENTS

WO WO2019055075 A1 3/2019

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).

(Continued)

*Primary Examiner* — Fernando L Toledo
*Assistant Examiner* — Valerie N Newton
(74) *Attorney, Agent, or Firm* — The Marbury Law Group PLLC

(57) ABSTRACT

A memory device includes a channel, a control gate electrode, and at least one charge storage element located between the channel and the control gate electrode. The control gate electrode includes a first electrically conductive layer, a second electrically conductive layer and a ferroelectric material layer located between the first electrically conductive layer and the second electrically conductive layer.

20 Claims, 28 Drawing Sheets

(56) References Cited

U.S. PATENT DOCUMENTS

| | | | |
|---|---|---|---|
| 6,898,105 | B2 | 5/2005 | Sakai et al. |
| 7,378,286 | B2 | 5/2008 | Hsu et al. |
| 8,349,681 | B2 | 1/2013 | Alsmeier et al. |
| 9,558,804 | B2 | 1/2017 | Muller |
| 9,589,839 | B1 | 3/2017 | Ikawa et al. |
| 9,780,182 | B2 | 10/2017 | Peri et al. |
| 9,806,093 | B2 | 10/2017 | Toyama et al. |
| 9,865,608 | B2 | 1/2018 | Mueller et al. |
| 9,941,299 | B1 * | 4/2018 | Chen ............ H01L 27/11597 |
| 9,984,963 | B2 | 5/2018 | Peri et al. |
| 10,199,351 | B2 | 2/2019 | Flores et al. |
| 2009/0310414 | A1 | 12/2009 | Lee et al. |
| 2016/0225866 | A1 | 8/2016 | Peri et al. |
| 2016/0351497 | A1 | 12/2016 | Peri et al. |
| 2017/0179152 | A1 | 6/2017 | Toyama et al. |
| 2017/0194284 | A1 | 7/2017 | Flores et al. |
| 2017/0352669 | A1 * | 12/2017 | Sharangpani ..... H01L 29/66833 |
| 2019/0244973 | A1 * | 8/2019 | Yoo .................... H01L 21/022 |
| 2020/0303558 | A1 * | 9/2020 | Fujii ................. H01L 27/11524 |

OTHER PUBLICATIONS

Chauhan, Y. S., "Negative Capacitance MOSFETs for Future Technology Nodes," Nanolab, Department of Electrical Engineering IIT Kanpur, India, Presentation, pp. 1-68, (2017).

Khan, A. I. et al., "Negative capacitance in a ferroelectric capacitor," Nature Materials Letters, vol. 14, pp. 182-186, (2015).

Li, K.S. et al., "Sub-60mV-Swing Negative-Capacitance FinFET without Hysteresis," IEEE, 22.6.1-22.6.4, IEDM15-620-623, (2015).

Muller, J. et al., "Ferroelectric Hafnium Oxide Based Materials and Devices: Assessment of Current Status and Future Prospects," ECS Journal of Solid State Science and Technology, vol. 4, No. 5, pp. N30-N35, (2015).

Muller, J. et al., "Ferroelectric Hafnium Oxide: A CMOS-Compatible and Highly Scalable Approach to Future Ferroelectric Memories," IEEE, IEDM 13-280-283, pp. 10.8.1-10.8.4, (2013).

Muller, J. et al., "Ferroelectricity in Simple Binary $ZrO_2$ and $HfO_2$," NANO Letters, vol. 12, pp. 4318-4323, (2012).

Pahwa, G. et al., "Physical Insights on Negative Capacitance Transistors in Nonhysteresis and Hysteresis Regimes: MFMIS Versus MFIS Structures," IEEE Transactions on Electron Devices, vol. 65, No. 3, pp. 867-873, (2018).

Salahuddin, S. et al., "Use of Negative Capacitance to Provide Voltage Amplification for Low Power Nanoscale Devices," Nano Letters, vol. 8, No. 2, pp. 405-410, (2008).

U.S. Appl. No. 15/873,101, filed Jan. 17, 2018, SanDisk Technologies LLC.

U.S. Appl. No. 16/227,889, filed Dec. 20, 2018, SanDisk Technologies LLC.

U.S. Appl. No. 16/249,300, filed Jan. 16, 2019, SanDisk Technologies LLC.

Notification of Transmittal of the International Search Report and Written Opinion of the International Search Authority or International Patent Application No. PCT/US2019/068654, dated Apr. 1, 2020, 14 pages.

\* cited by examiner

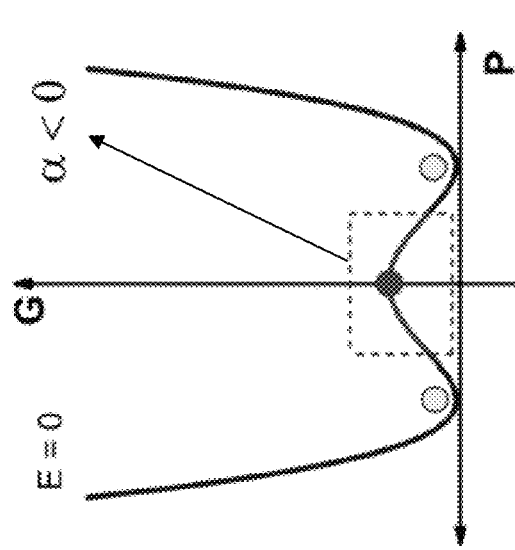
FIG. 1A (Prior Art)
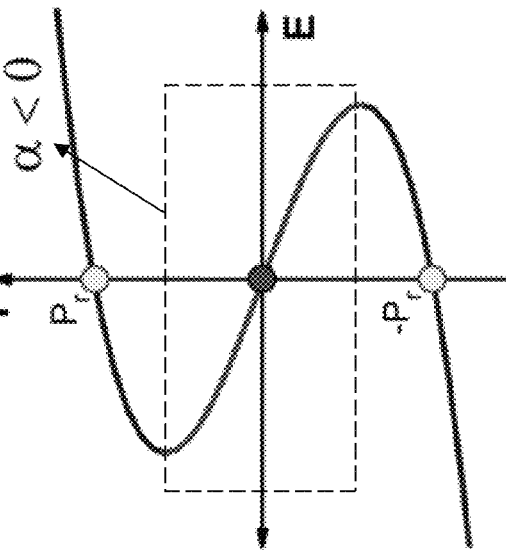
FIG. 2A (Prior Art)
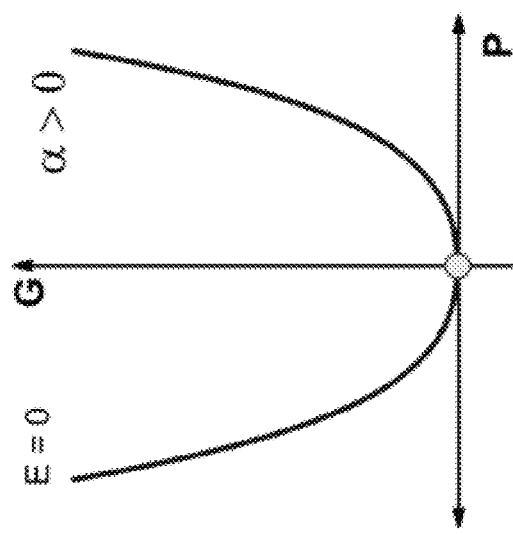
FIG. 1B (Prior Art)
FIG. 2B (Prior Art)

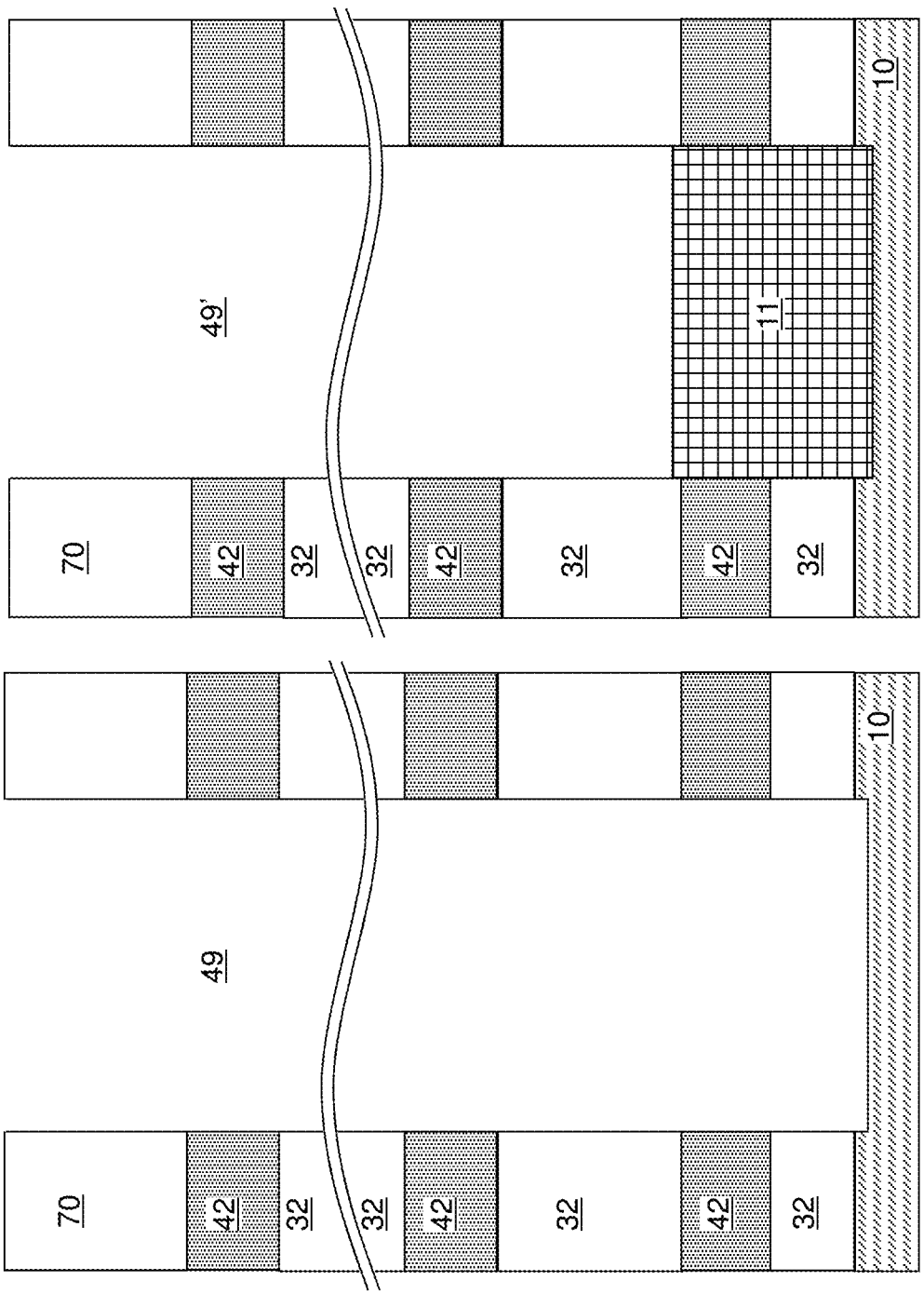

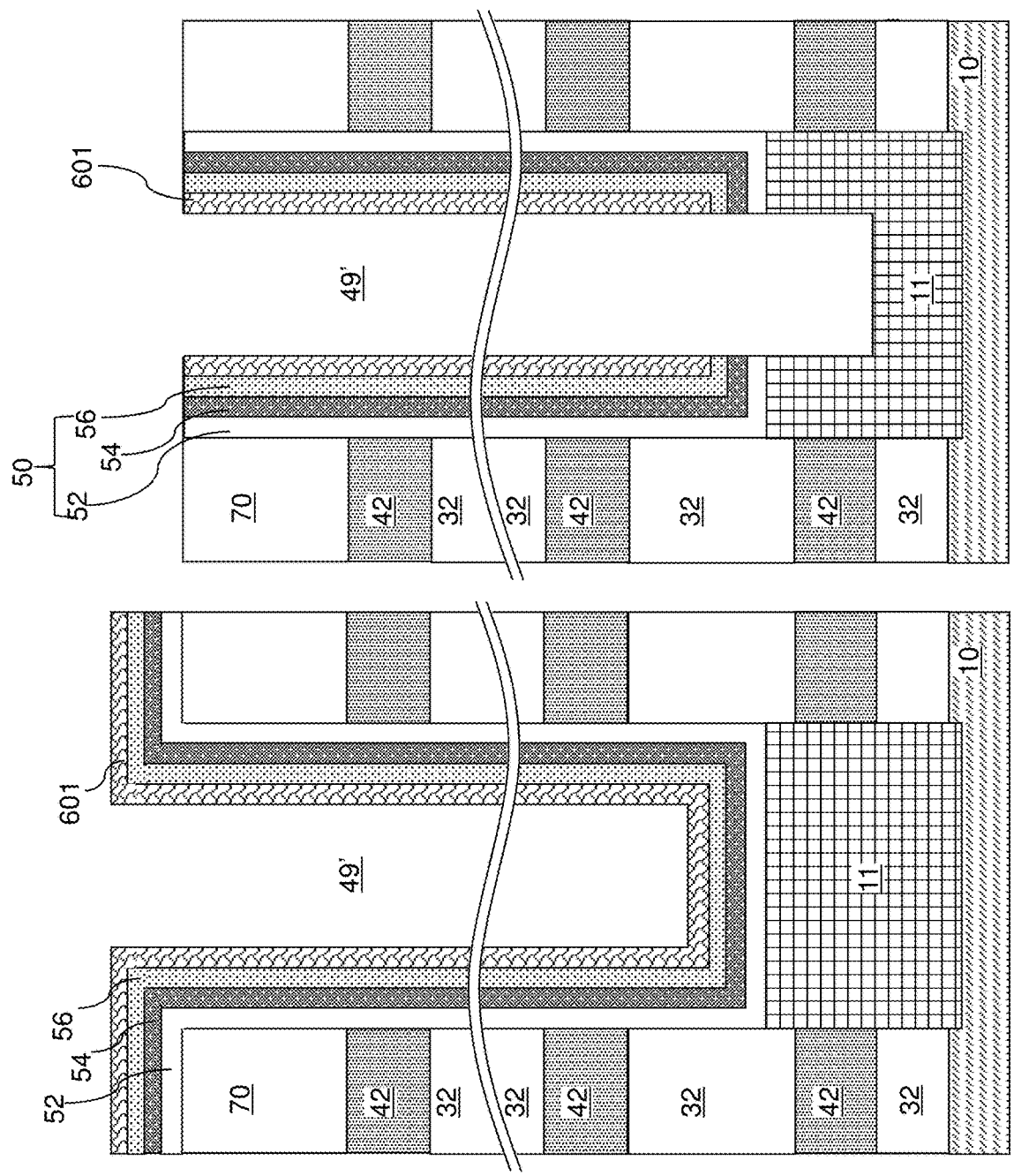

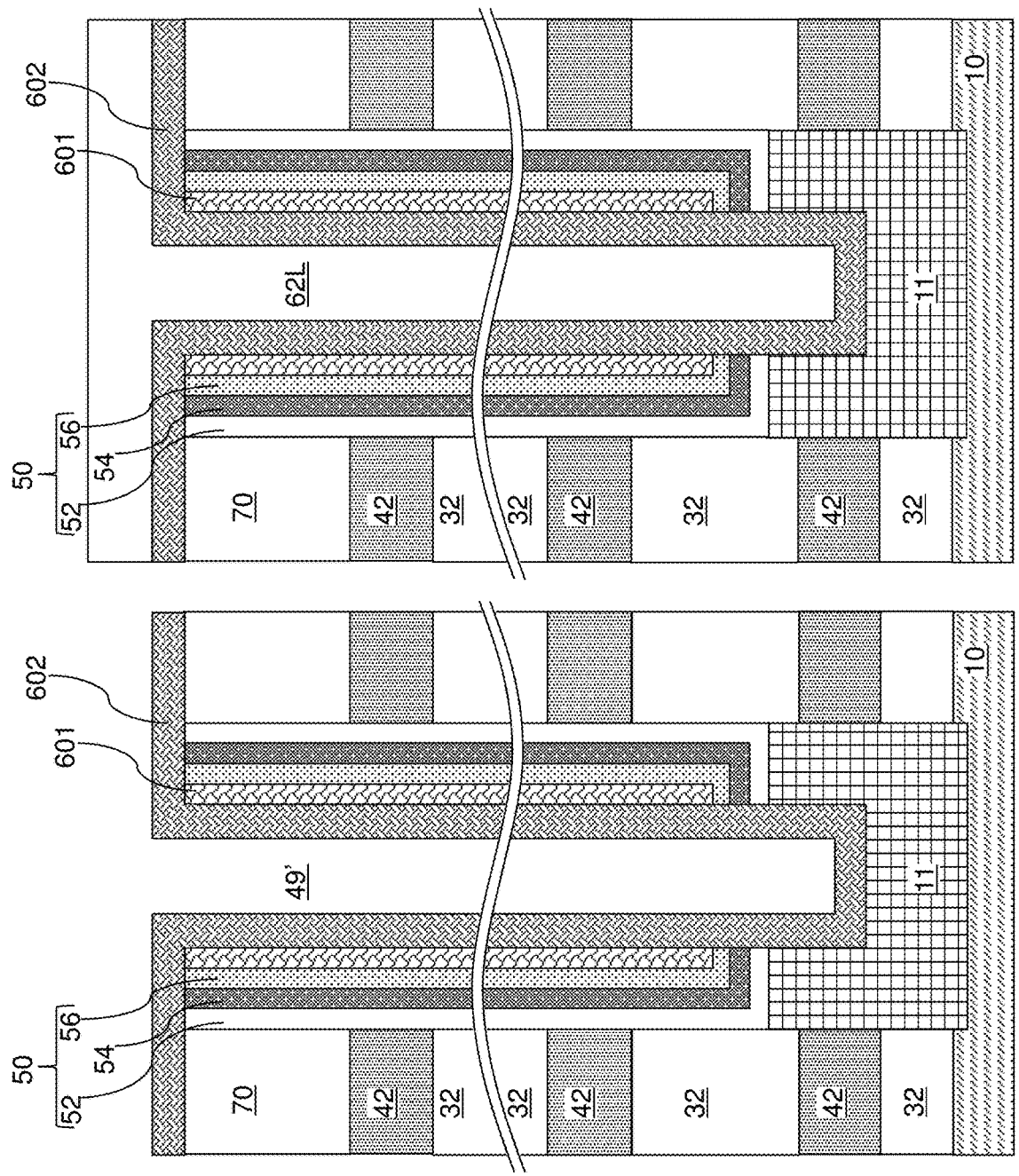

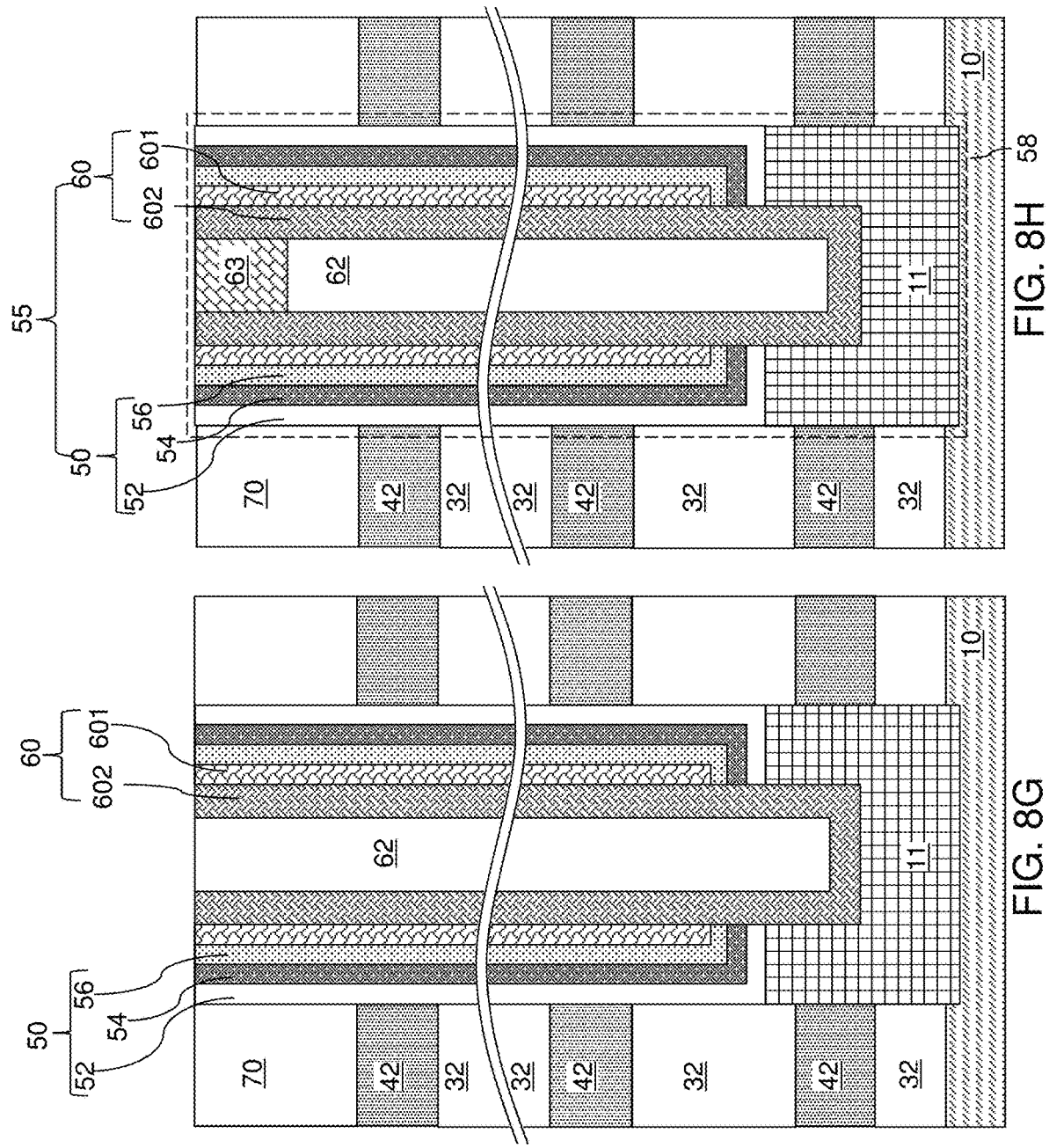

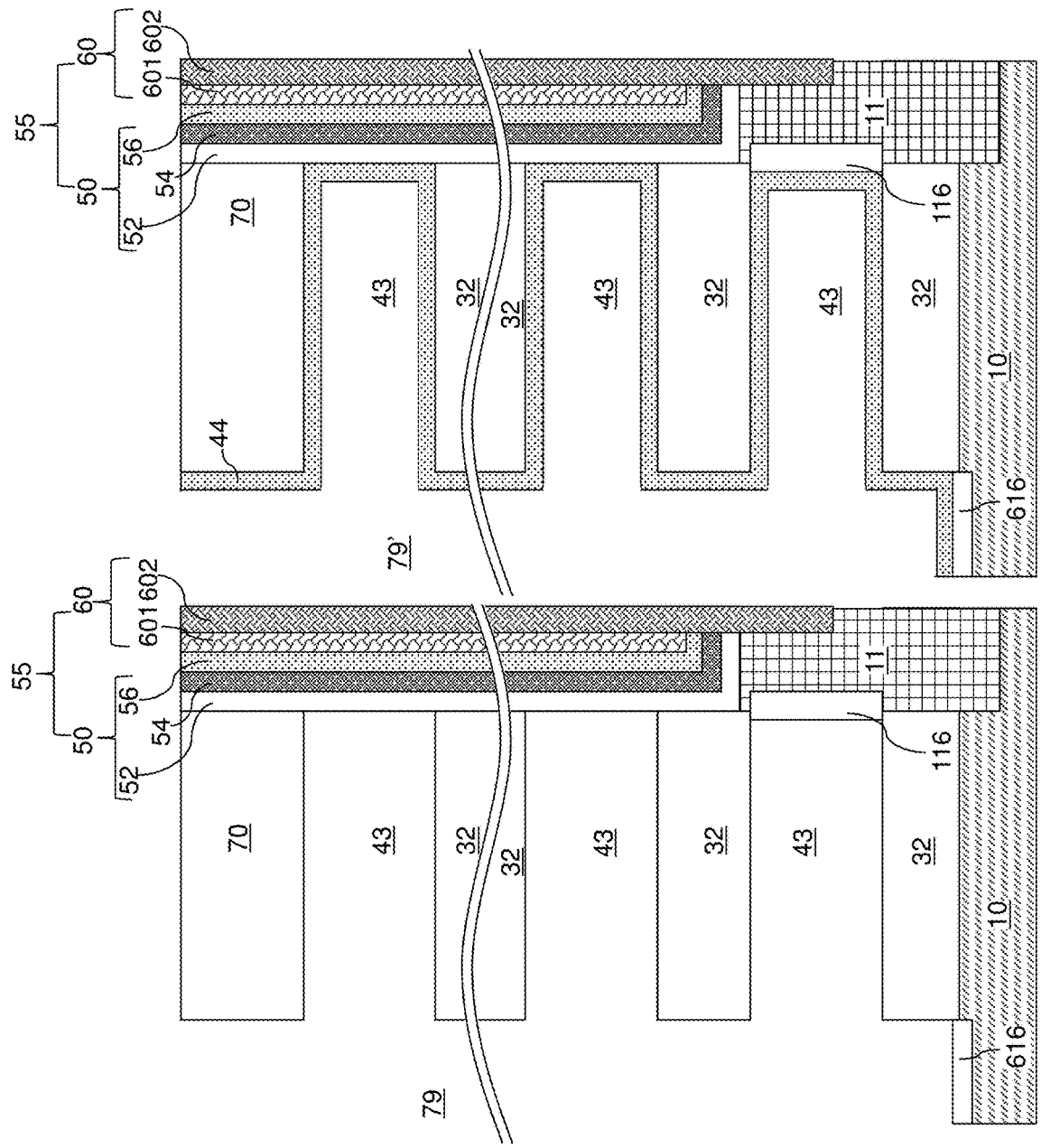

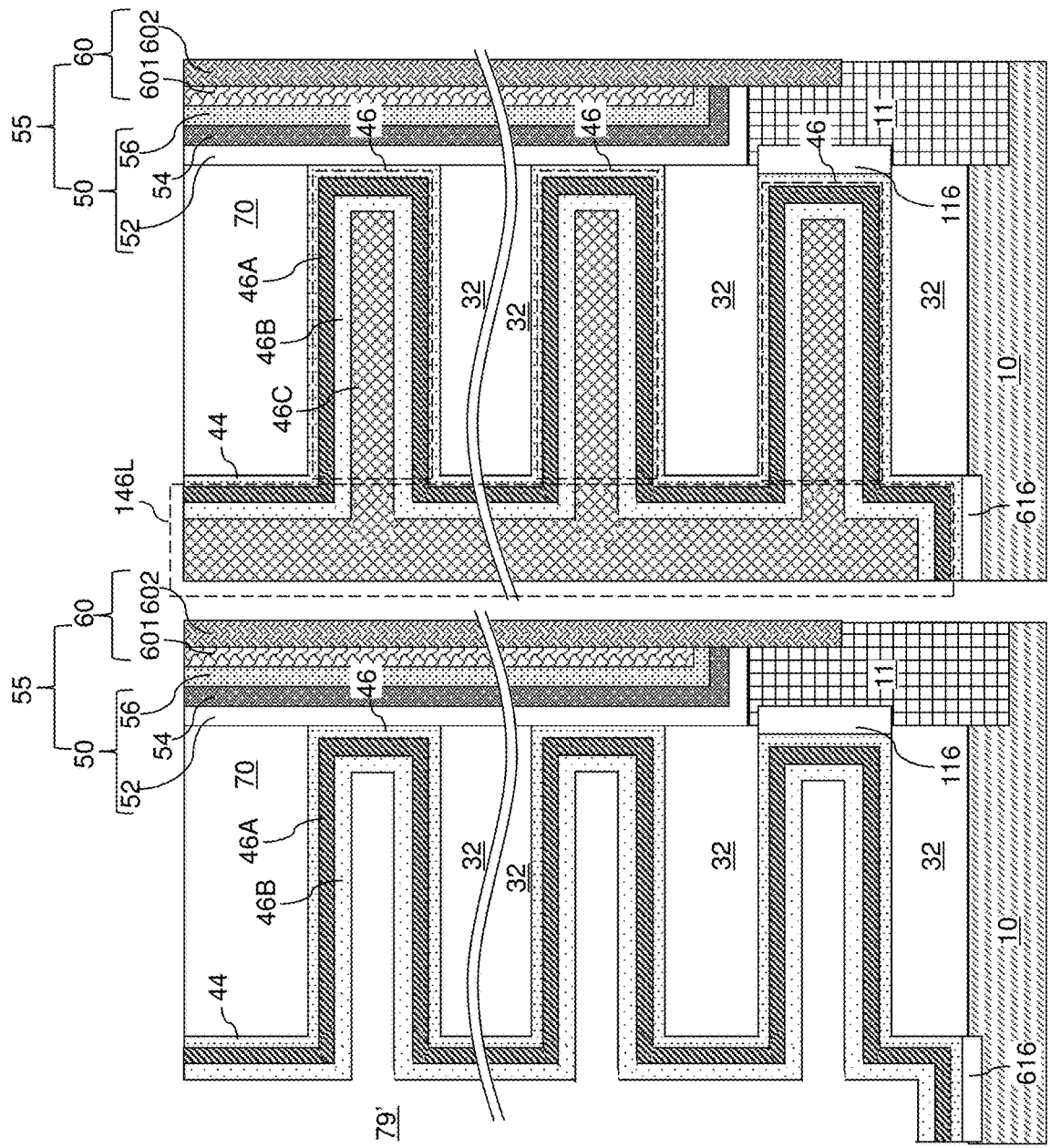

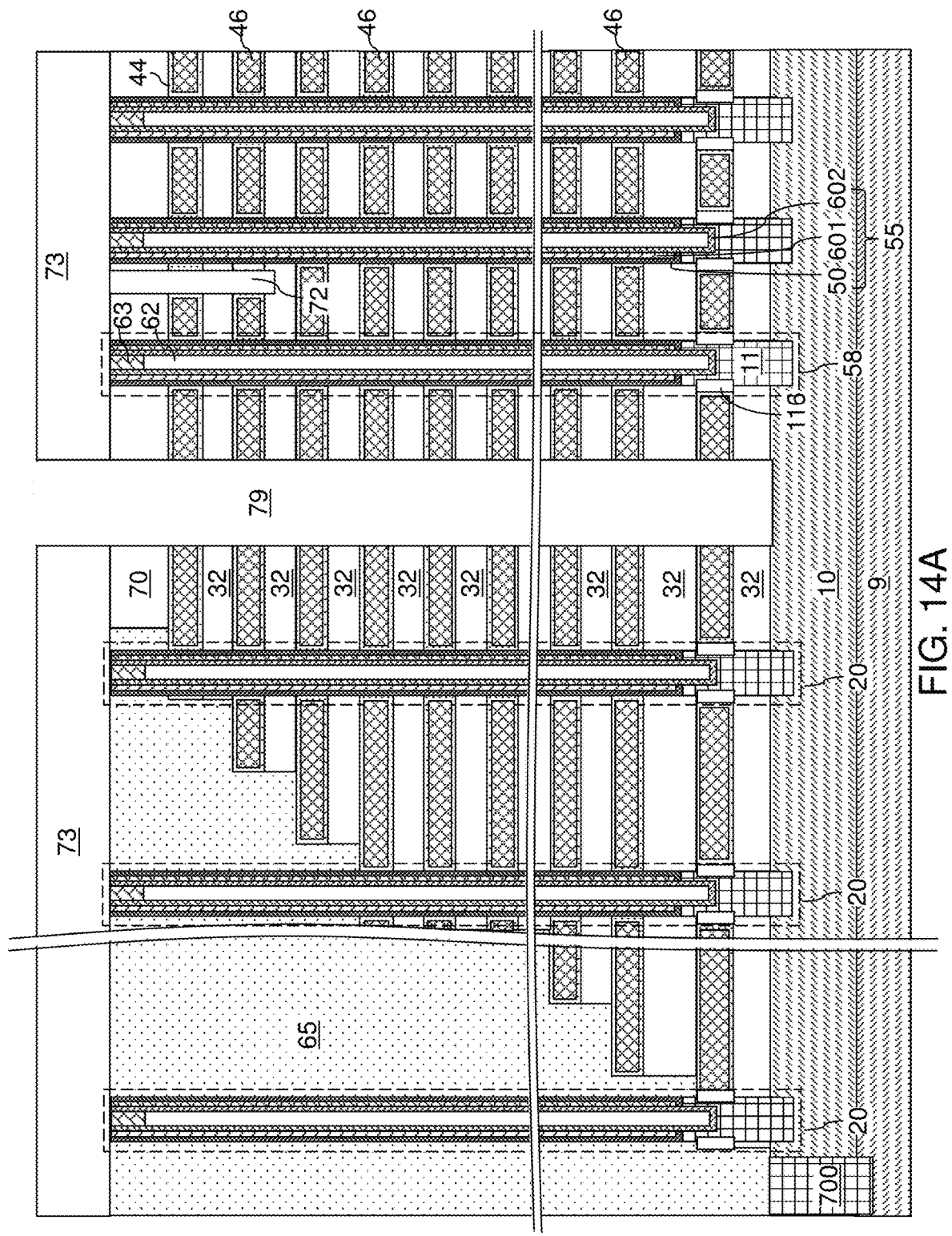

CHARGE STORAGE MEMORY DEVICE INCLUDING FERROELECTRIC LAYER BETWEEN CONTROL GATE ELECTRODE LAYERS AND METHODS OF MAKING THE SAME

FIELD

The present disclosure relates generally to the field of semiconductor devices, and particular to a charge memory device containing a ferroelectric layer between control gate electrode layers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device includes a channel, a control gate electrode, and at least one charge storage element located between the channel and the control gate electrode. The control gate electrode includes a first electrically conductive layer, a second electrically conductive layer and a ferroelectric material layer located between the first electrically conductive layer and the second electrically conductive layer.

According to another aspect of the present disclosure, a method of forming a three-dimensional memory device is provided, which comprises: forming an alternating stack of insulating layers and sacrificial material layers over a substrate; forming memory openings through the alternating stack; forming memory stack structures located within a memory opening that extends through the alternating stack, wherein each of the memory stack structures comprises a memory film and a vertical semiconductor channel contacting the memory film; and replacing the sacrificial material layers with electrode layers, wherein each of the electrode layers comprises a layer stack including a metallic barrier layer comprising a first metallic material, a ferroelectric material layer in contact with the metallic barrier layer, and a metallic fill material layer comprising a second metallic material, contacting the ferroelectric material layer, and is spaced from the metallic barrier layer by the ferroelectric material layer.

BRIEF DESCRIPTION OF THE DRAWINGS

FIG. 1A is a Gibbs free energy diagram for a non-ferroelectric material as a function of polarization.

FIG. 1B is a graph illustrating polarization of a non-ferroelectric material as a function of an applied electrical field.

FIG. 2A is a Gibbs free energy diagram for a ferromagnetic material as a function of polarization.

FIG. 2B is a graph illustrating polarization of a ferroelectric material as a function an applied electrical field.

FIGS. 8A-8H are sequential schematic vertical cross-sectional views of a memory opening within the exemplary structure during formation of a memory stack structure, an optional dielectric core, and a drain region therein according to an embodiment of the present disclosure.

FIGS. 12A-12D are sequential vertical cross-sectional views of a region of the exemplary structure during formation of electrode layers according to an embodiment of the present disclosure.

FIG. 14A is a schematic vertical cross-sectional view of the exemplary structure after removal of a deposited conductive material from within the backside trench according to an embodiment of the present disclosure.

DETAILED DESCRIPTION

Figure 3:
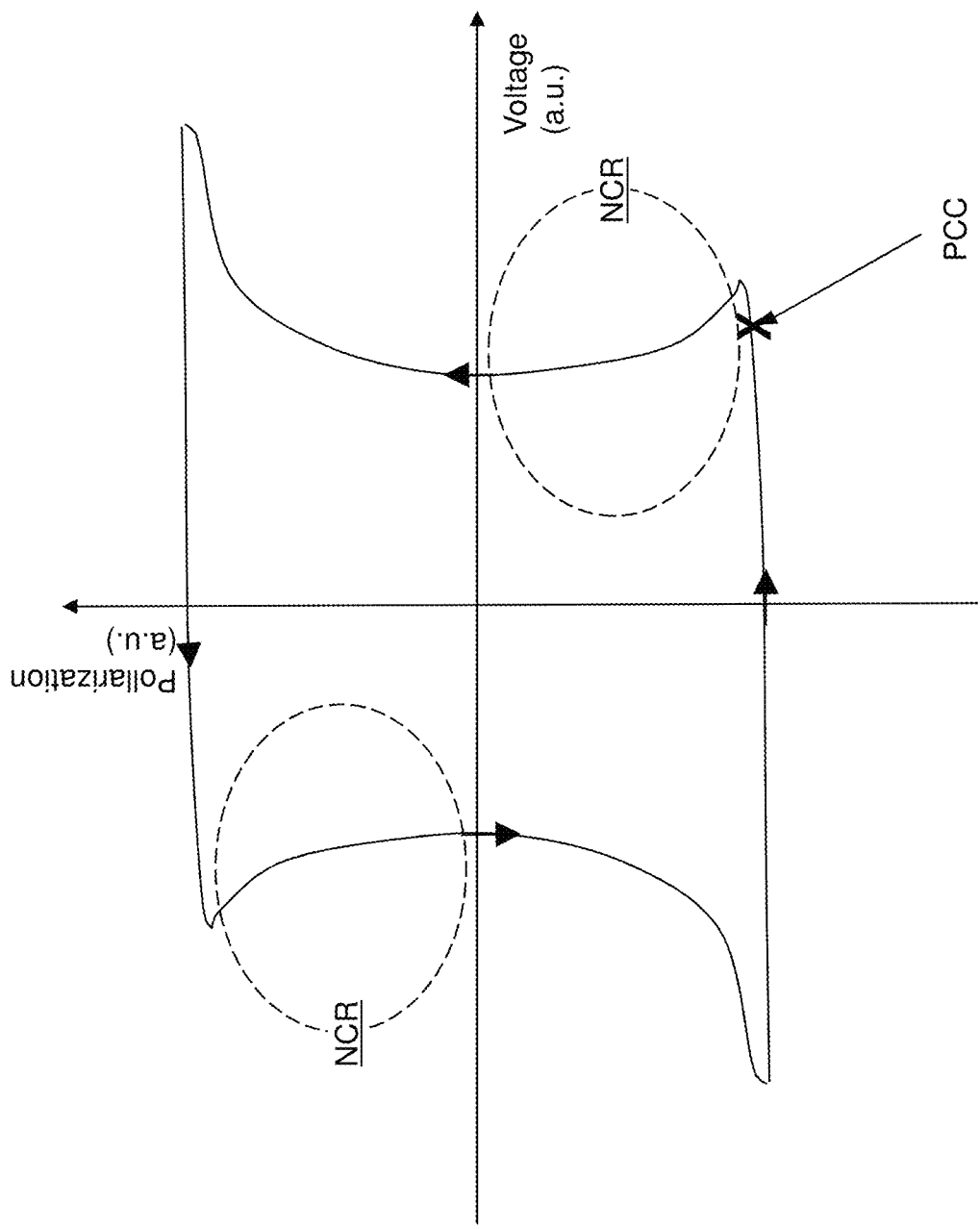
FIG. 3 is graph illustrating a hysteresis curve for polarization of a ferroelectric material as a function of an applied voltage thereacross.

High RC delay in the word lines/control gate electrodes limit the speed of operation of charge storage memory devices, such as NAND memory devices. As discussed above, the embodiments of the present disclosure are directed to charge storage memory devices containing a ferroelectric layer between control gate electrode layers. The ferroelectric layer is believed to reduce the RC delay and increase the operational speed of the device. The embodiments of the disclosure can include multilevel memory structure, non-limiting examples of which include three-dimensional monolithic memory array devices comprising a plurality of NAND memory strings or two-dimensional memory devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function.

Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

FIG. 1A illustrates the Gibbs free energy G for a non-ferroelectric material as a function of polarization P of electrical charges within the non-ferroelectric material. The net polarization P of electrical charges within the non-ferroelectric material is zero in the minimum energy state. FIG. 1B illustrates polarization P of a non-ferroelectric material as a function of an applied electrical field E. Polarization P of electrical charges within the non-ferroelectric material is generally proportional to the applied electrical field E with some non-linearity in some cases. The derivative a of the polarization P with respect to the applied electrical field E, i.e., the slope of the curve of FIG. 1B, is positive for a non-ferroelectric material.

FIG. 2A illustrates the Gibbs free energy G for a ferroelectric material as a function of polarization P of electrical charges within the ferroelectric material. The net polarization P of electrical charges within the ferroelectric material is non-zero in the minimum energy state(s). Thus, spontaneous ferroelectric polarization of the material occurs, and the ferroelectric material accumulates surfaces charges of opposite polarity types on two opposing surfaces.

FIG. 2B illustrates polarization P of a ferroelectric material as a function of an applied electrical field E. Polarization P of electrical charges within the ferroelectric material increases with the magnitude of the applied electrical field E only when the magnitude of the applied electrical filed E has sufficient magnitude that is equal to the electrical field induced by the spontaneous polarization of the ferroelectric material. When the magnitude of the external electrical field is less than the magnitude of the internal electrical field caused by spontaneous polarization of the ferroelectric material, the derivative a of the polarization P with respect to the applied electrical field E, i.e., the slope of the curve of FIG. 2B, is negative for the ferroelectric material, thereby causing the phenomenon known as negative capacitance. The phenomenon of negative capacitance occurs when an increment in applied electrical field causes a decrease in the electrical charge of the material that accumulates on one side of the material. In other words, the derivative of the accumulated charge with respect to the applied electrical field is negative when the phenomenon of negative capacitance occurs.

Referring to FIG. 3, a hysteresis curve for polarization P of a ferroelectric material as a function of an applied voltage V thereacross is schematically illustrated. The horizontal axis and the vertical axis of the hysteresis curve of FIG. 3 are in an arbitrary scale, and schematically represents the data presented in A. I. Khan et al., *Negative capacitance in a ferroelectric capacitor*, Nature Materials Vol. 14, pp. 182-186 (2015), the entire contents of which are incorporated herein by reference. The phenomenon of negative capacitance occurs when the slope of the hysteresis curve becomes negative. The regions of negative capacitance NCR are schematically illustrated in FIG. 3.

According to an aspect of the present disclosure, a charge storage memory device contains at least one charge storage element, such as a silicon nitride charge trapping layer and/or floating gates, and control gate electrode containing a thin embedded ferroelectric material layer between two control gate electrode electrically conductive layers. The control gate electrode electrically conductive layers can be pre-charged with a bias voltage that places the electrode layers in a pre-charged condition PCC. The pre-charged condition PCC is a condition in which the ferroelectric material is biased at a voltage that does not exhibit negative capacitance, but is close to exhibiting negative capacitance upon application of a small incremental voltage. The voltage margin between the pre-charged condition PCC and the voltage at which the ferroelectric material begins to exhibit negative capacitance depends on the repeatability of the device structure during a manufacturing process and the voltage noise present within the device during operation. Generally, a voltage margin in a range from 0.1 V to 1.0 V may be employed.

The thickness of the ferroelectric material layer between the control gate electrode electrically conductive layers can be optimized to maximize the effect of negative capacitance during operation. In one embodiment, the thickness of the ferroelectric material layer is preferably 25 nm or less. In one embodiment, the thickness of the ferroelectric material layer between the control gate electrode electrically conductive layers may be in a range from 2 nm to 25 nm, such as from 5 nm to 15 nm. It is believed that a ferroelectric material layer thicker than 25 nm may improve the on-current and the off-current of NAND memory device, but tends to reduce the voltage drop for the NAND memory device and decreases the program efficiency and the erase efficiency. Conversely, ferroelectric material layer having a thickness of 25 nm or less, such as 2 nm to 25 nm may be less effective in improving the on-current and the off-current, but may results in less voltage drop for the NAND memory device and thus provides higher efficiency for program operations and erase operations.

In the paragraphs below, the first embodiment of the present disclosure describes a three-dimensional NAND charge storage memory device. It is understood, however, that the invention described in the present disclosure can be applied to any other memory device employing words lines/control to effectively reduce the capacitance between the control gate electrode electrically conductive layers and other device components, such as semiconductor channels by combining the negative capacitance induced by a ferroelectric material layer with typical positive capacitance among the device components. The RC delay during operation can be reduced through the negative capacitance provided by the ferroelectric material layer, and a faster operational speed and additional benefits can be provided by the ferroelectric material in the words lines/control gate electrodes. Furthermore, the sub-threshold slope and current of the device may be improved by addition of the ferroelectric material layer, which may help reduce read noise and/or permitting further stacking of the devices.

Figure 4:
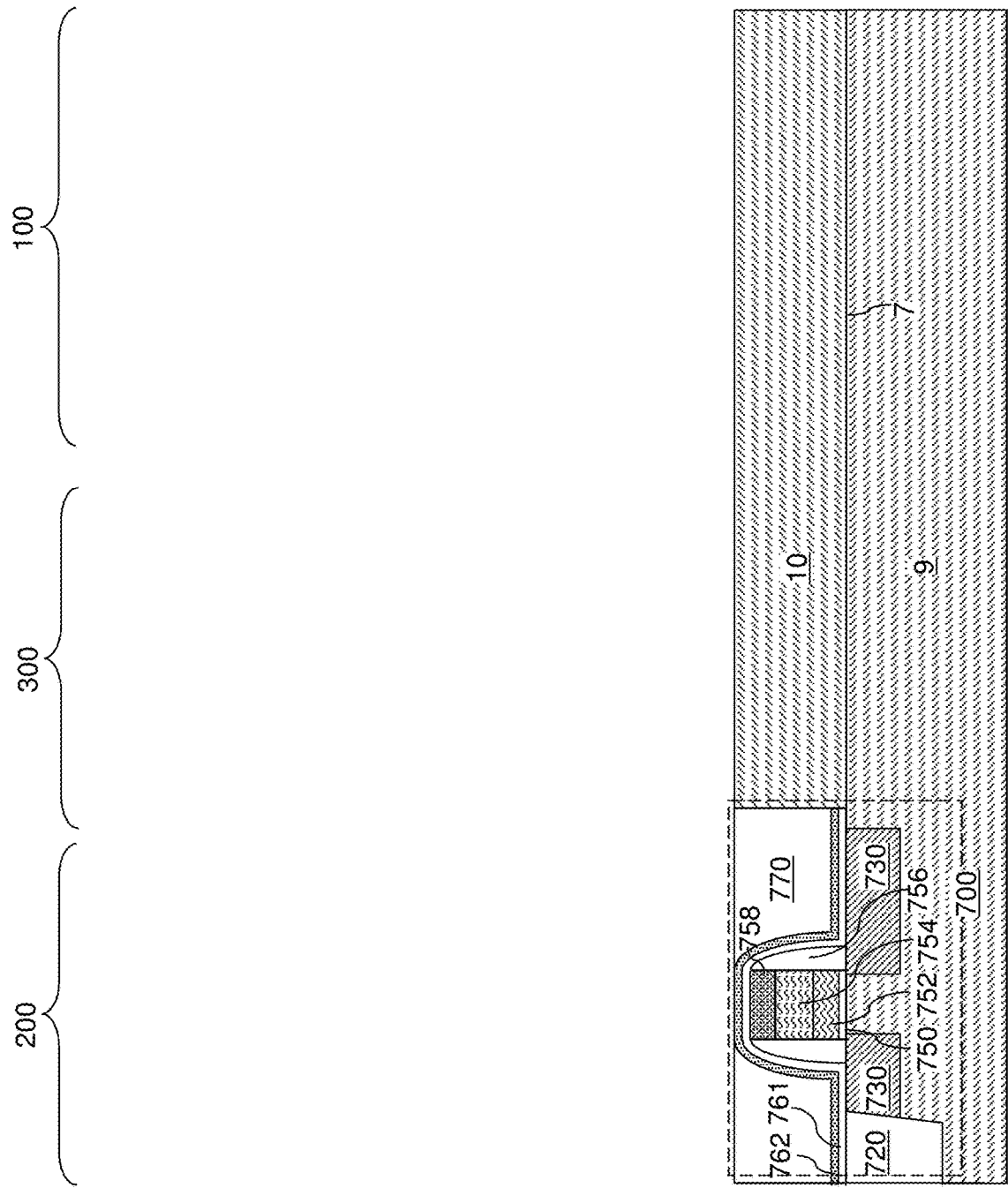
FIG. 4 is a schematic vertical cross-sectional view of an exemplary structure after formation of at least one peripheral device and a semiconductor material layer according to an embodiment of the present disclosure.

Referring to FIG. 4, an exemplary structure according to the first embodiment of the present disclosure is illustrated, which can be employed, for example, to fabricate a device structure containing a vertical (i.e., three-dimensional) NAND memory device. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrode layers can be provided between the memory array region 100 and the peripheral device region 200.

Figure 5:
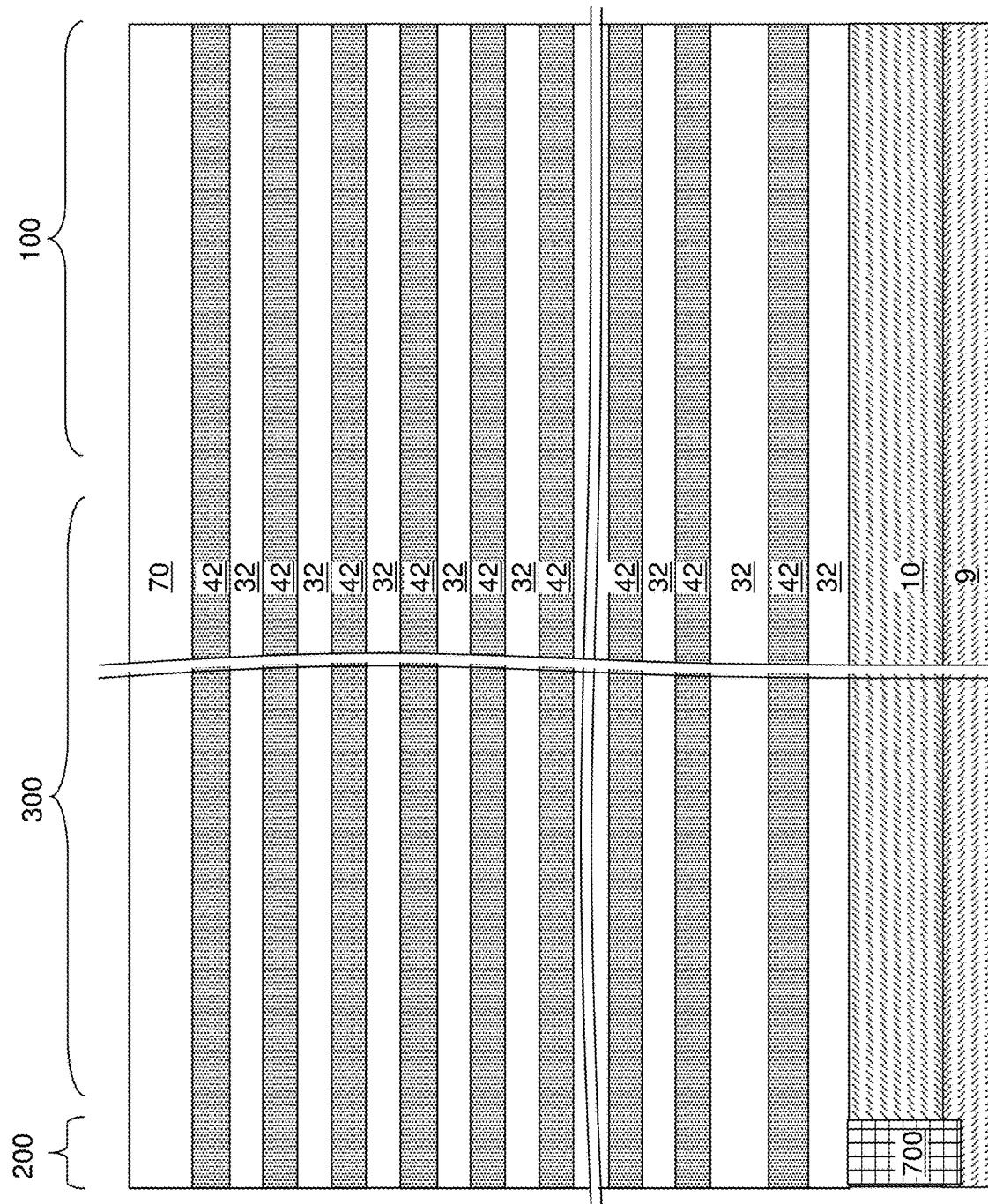
FIG. 5 is a schematic vertical cross-sectional view of the exemplary structure after formation of an alternating stack of insulating layers and sacrificial material layers according to an embodiment of the present disclosure.

Referring to FIG. 5, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrode layers, embodiments are expressly contemplated herein in which the sacrificial material layers are formed as electrode layers. In this case, steps for replacing the spacer material layers with electrode layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 6:
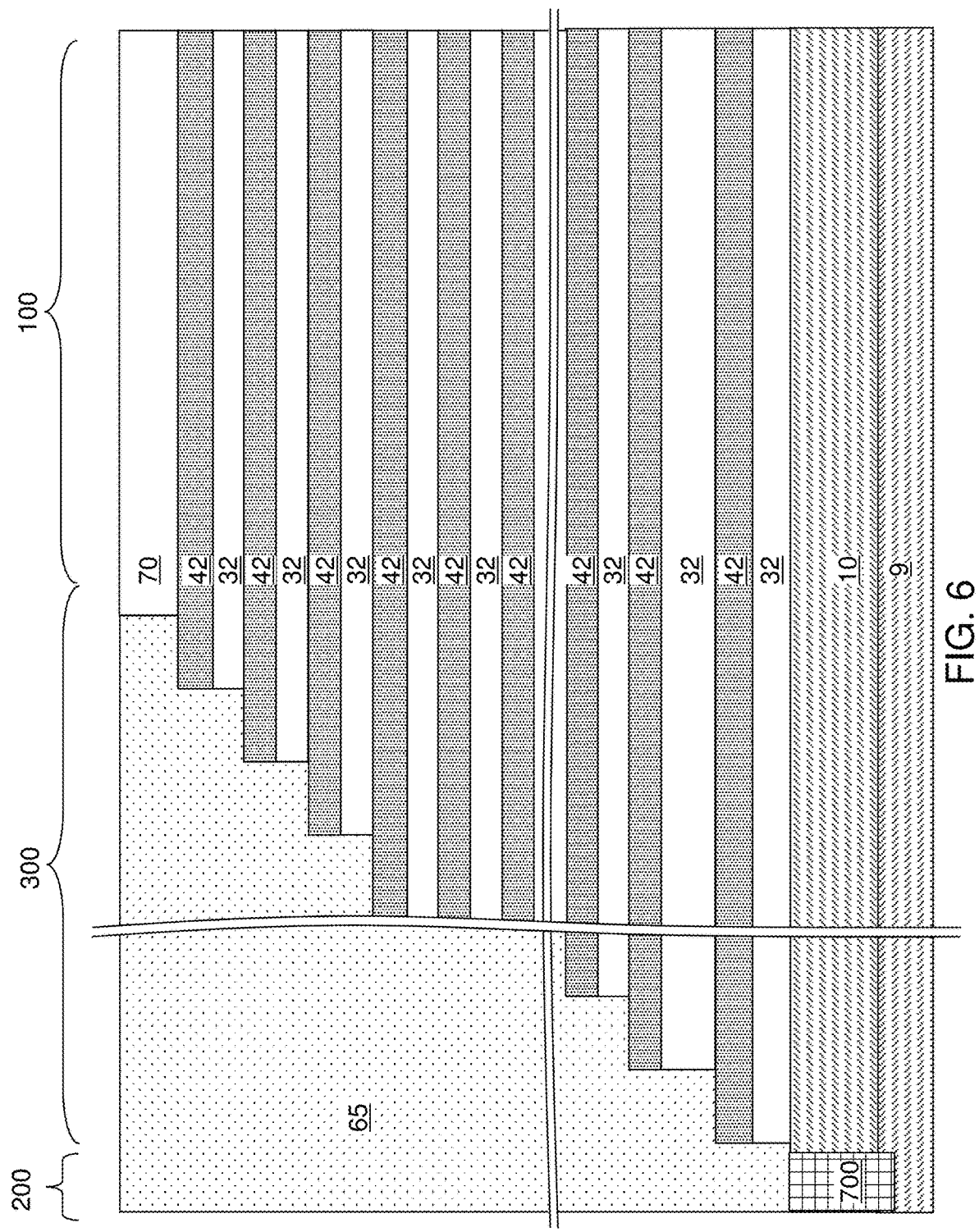
FIG. 6 is a schematic vertical cross-sectional view of the exemplary structure after formation of stepped terraces and a retro-stepped dielectric material portion according to an embodiment of the present disclosure.

Referring to FIG. 6, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 7A:
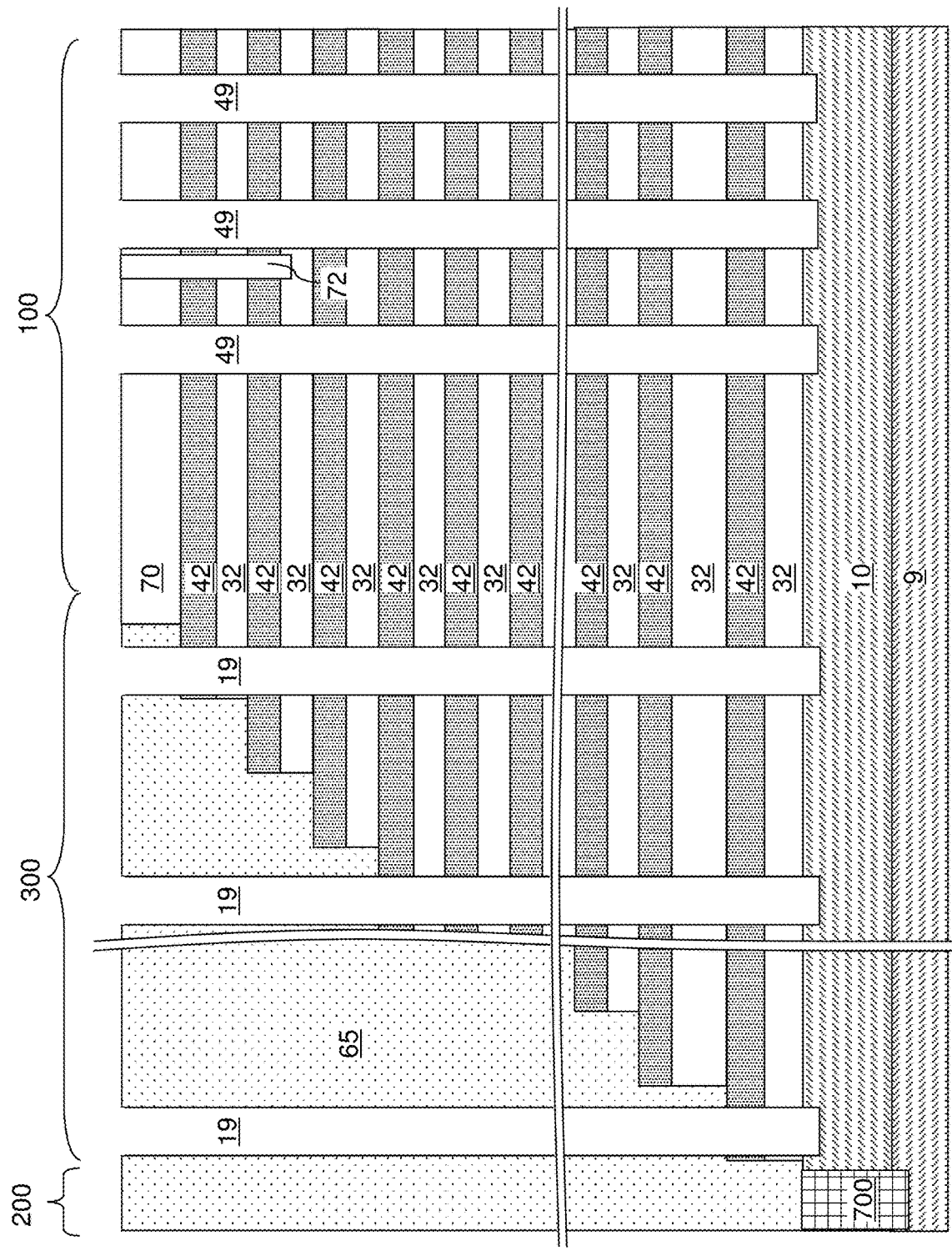
FIG. 7A is a schematic vertical cross-sectional view of the exemplary structure after formation of memory openings and support openings according to an embodiment of the present disclosure.
Figure 7B:
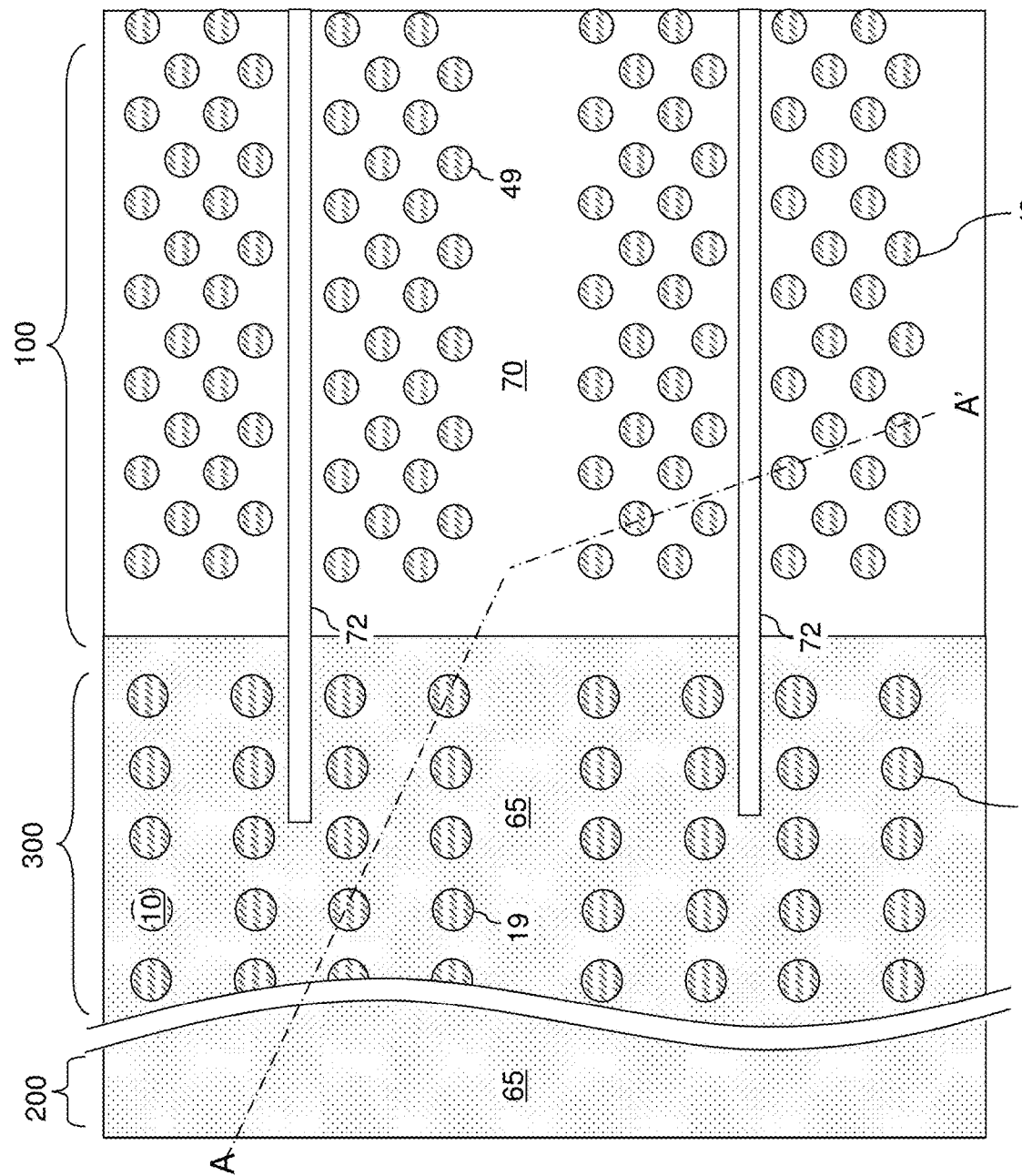
FIG. 7B is a top-down view of the exemplary structure of FIG. 7A. The vertical plane A-A' is the plane of the cross-section for FIG. 7A.

Referring to FIGS. 7A and 7B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 8A-8H illustrate structural changes in a memory opening 49, which is one of the memory openings 49 in the exemplary structure of FIGS. 7A and 7B. The same structural change occurs simultaneously in each of the other memory openings 49 and in each of the support openings 19.

Referring to FIG. 8A, a memory opening 49 in the exemplary device structure of FIGS. 7A and 7B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 8B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 8C, a stack of layers including a front-side blocking dielectric layer 52, a charge storage layer 54, a tunneling dielectric layer 56, and an optional first semiconductor channel layer 601 can be sequentially deposited in the memory openings 49.

The front-side blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least one oxygen. The dielectric metal oxide may consist essentially of the at least one metallic element and oxygen, or may consist essentially of the at least one metallic element, oxygen, and at least one non-metallic element such as nitrogen. In one embodiment, the front-side blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the front-side blocking dielectric layer 52 includes aluminum oxide. In one embodiment, the front-side blocking dielectric layer 52 can include multiple dielectric metal oxide layers having different material compositions.

Alternatively or additionally, the front-side blocking dielectric layer 52 can include a dielectric semiconductor compound such as silicon oxide, silicon oxynitride, silicon nitride, or a combination thereof. In one embodiment, the front-side blocking dielectric layer 52 can include silicon oxide. In this case, the dielectric semiconductor compound of the front-side blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the front-side blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 8D, the optional first semiconductor channel layer 601, the tunneling dielectric layer 56, the charge storage layer 54, and the front-side blocking dielectric layer 52 are sequentially anisotropically etched employing at least one anisotropic etch process. The portions of the first semiconductor channel layer 601, the tunneling dielectric layer 56, the charge storage layer 54, and the front-side blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the front-side blocking dielectric layer 52 at a bottom of each memory cavity 49' can be removed to form openings in remaining portions thereof. Each of the first semiconductor channel layer 601, the tunneling dielectric layer 56, the charge storage layer 54, and the front-side blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the front-side blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a front-side blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the front-side blocking dielectric layer 52 and the tunneling dielectric layer 56. In one embodiment, the first semiconductor channel layer 601, the tunneling dielectric layer 56, the charge storage layer 54, and the front-side blocking dielectric layer 52 can have vertically coincident sidewalls.

Referring to FIG. 8E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 8F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 8G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a front-side blocking dielectric layer 52, a charge storage layer 54, and a tunneling dielectric layer 56 collectively constitute a memory film 50, which can store electrical charges with a macroscopic retention time. In some embodiments, a front-side blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 8H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional front-side blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 9:
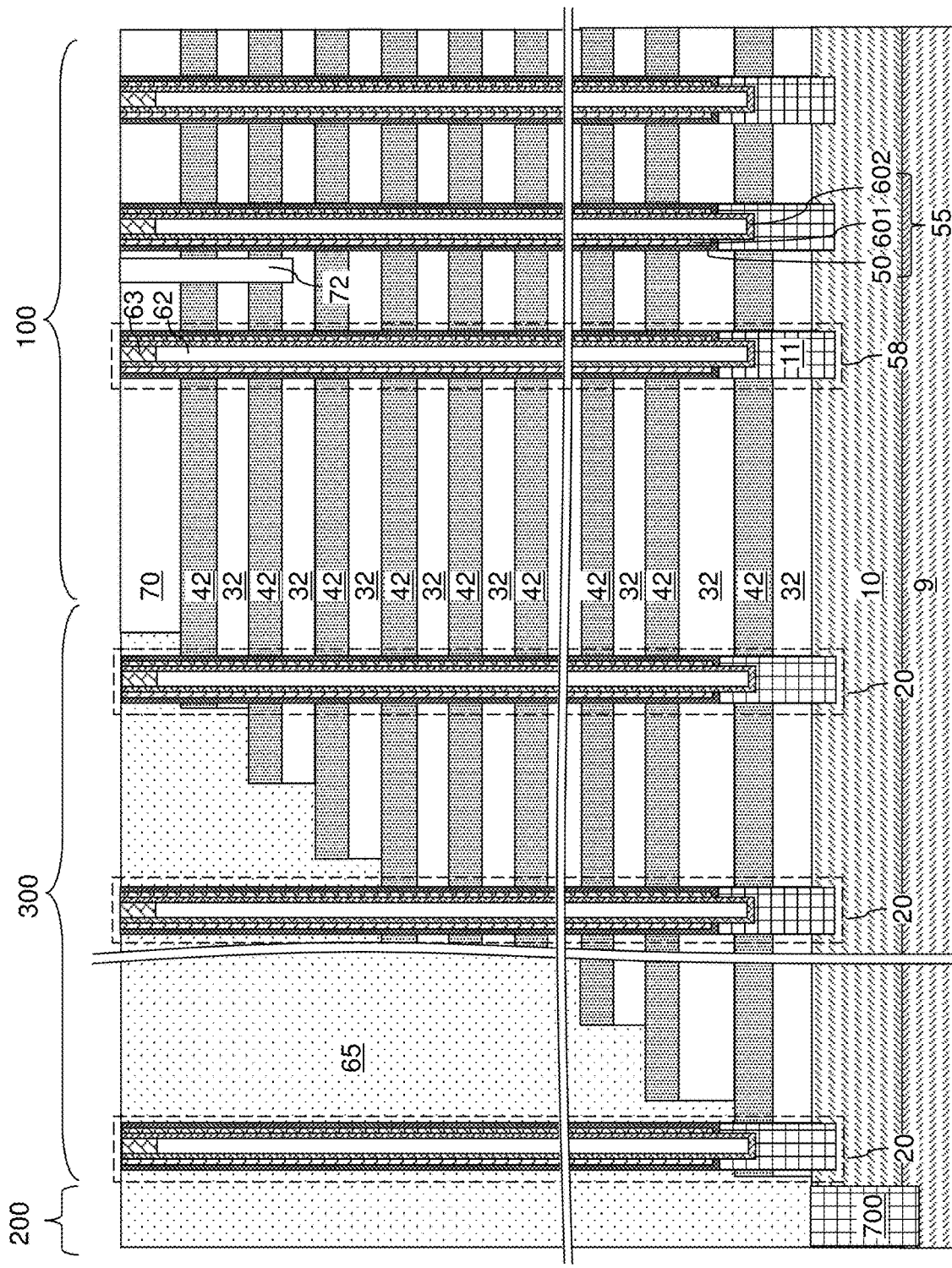
FIG. 9 is a schematic vertical cross-sectional view of the exemplary structure after formation of memory stack structures and support pillar structures according to an embodiment of the present disclosure.

Referring to FIG. 9, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 7A and 7B. An instance of the support pillar structure 20 can be formed within each support opening 19 of the structure of FIGS. 7A and 7B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (as embodied as a charge storage layer 54) laterally surrounding the tunneling dielectric layer 56, and an optional front-side blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Generally, each memory film 50 includes a tunneling dielectric layer 56 and charge storage elements including a respective charge storage material portion. The charge storage elements are located at levels of the sacrificial material layers 42, which are subsequently replaced with electrode layers. In one embodiment, each memory films 50 can include a charge storage layer deposited over a sidewall of a respective one of the memory openings 49. In one embodiment, each charge storage layer 54 includes a continuous layer of a charge storage material that vertically extends through multiple levels of the electrode layers to be subsequently formed. The charge storage material portions can comprise portions of the charge storage material that are located at levels of the electrode layers 46. A tunneling dielectric layer 56 can be deposited on each charge storage layer 54, and a vertical semiconductor channel 60 can be formed on each tunneling dielectric layer 56. Each vertical semiconductor channel 60 can comprise a semiconductor material having a doping of a first conductivity type, and a drain region 63 having a doping of a second conductivity type is located at a top end of each vertical semiconductor channel 60. Each memory stack structure 55 can be located within a memory opening 49 that extends through the alternating stack (32, 43).

Figure 10A:
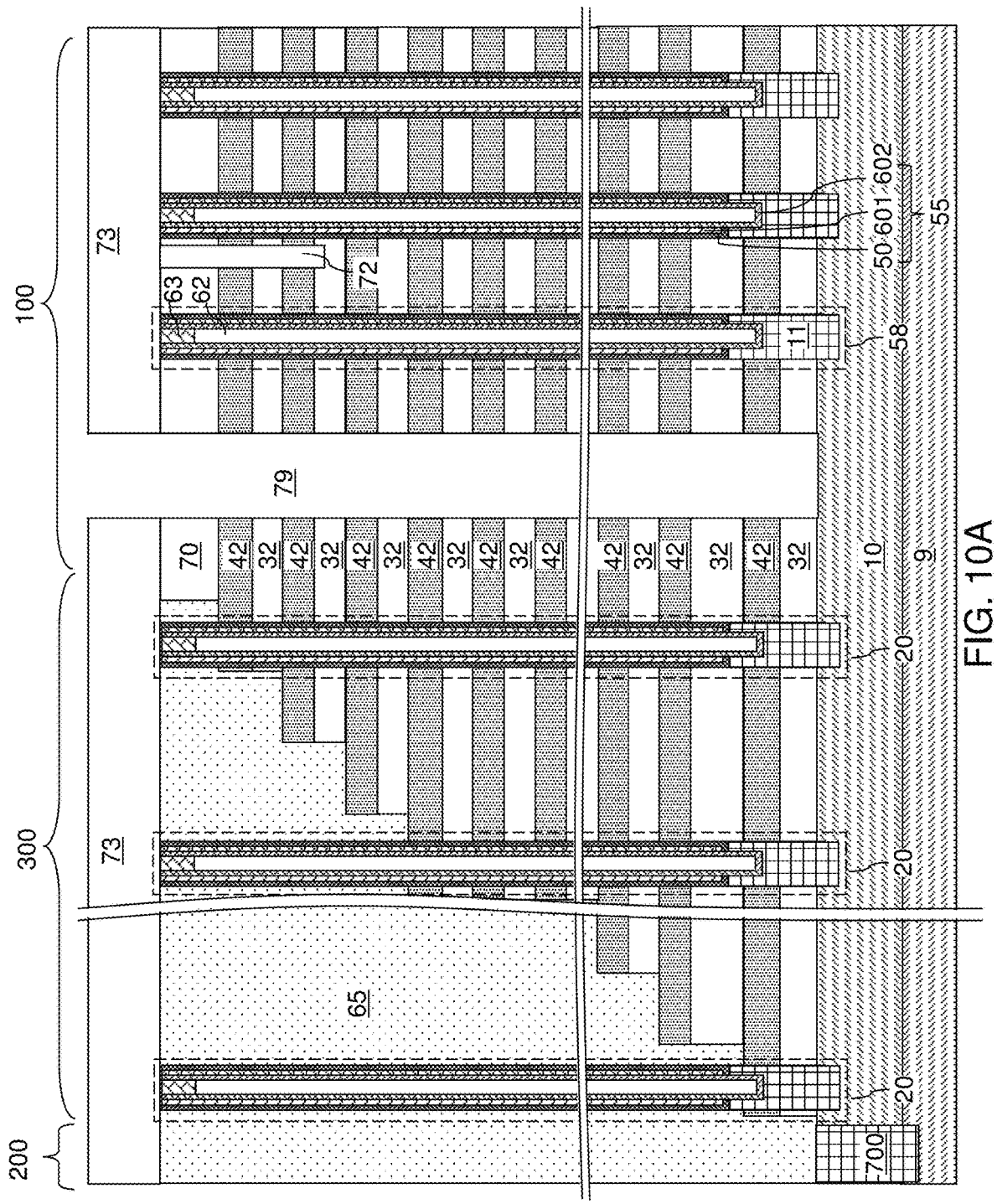
FIG. 10A is a schematic vertical cross-sectional view of the exemplary structure after formation of backside trenches according to an embodiment of the present disclosure.
Figure 10B:
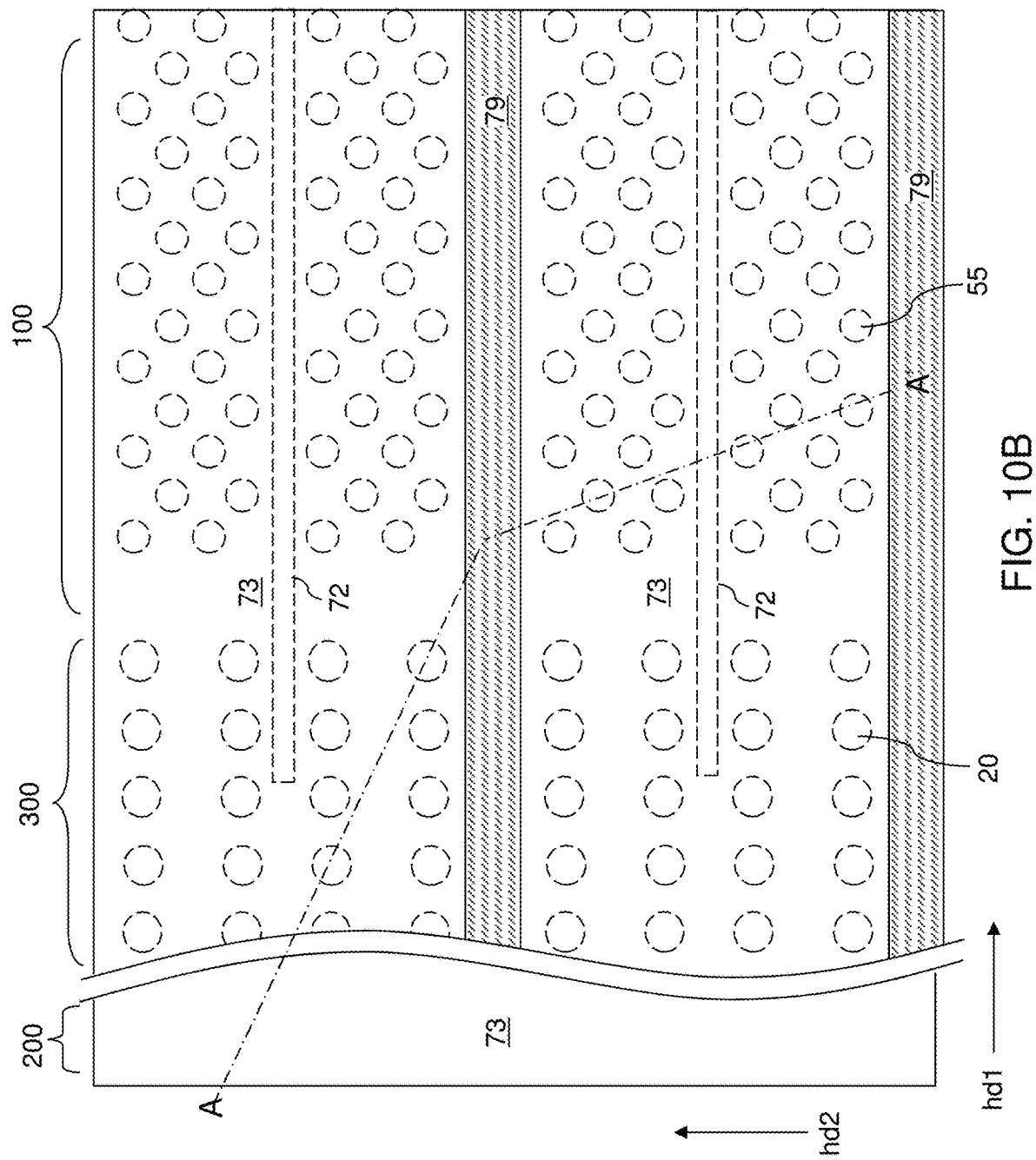
FIG. 10B is a partial see-through top-down view of the exemplary structure of FIG. 10A. The vertical plane A-A' is the plane of the schematic vertical cross-sectional view of FIG. 10A.

Referring to FIGS. 10A and 10B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 11:
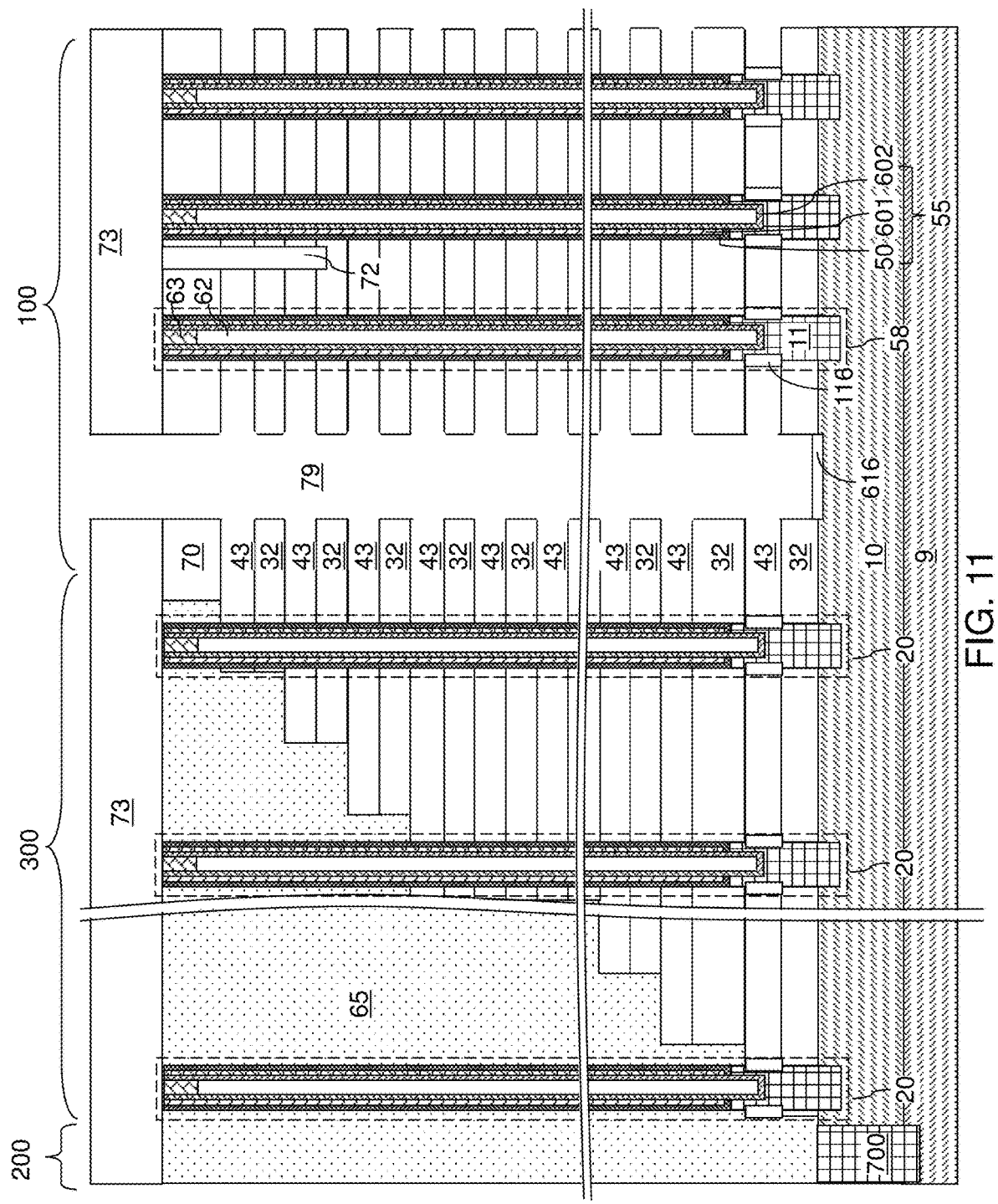
FIG. 11 is a schematic vertical cross-sectional view of the exemplary structure after formation of backside recesses according to an embodiment of the present disclosure.

Referring to FIGS. 11 and 12A, an etchant that selectively etches the second material of the sacrificial material layers 42 with respect to the first material of the insulating layers 32 can be introduced into the backside trenches 79, for example, employing an etch process. FIG. 12A illustrates a region of the exemplary structure of FIG. 8. The sacrificial material layers 42 can be etched selective to the insulating layers 32 and the memory stack structures 55 by providing an isotropic etchant into the backside trenches 79. Backside recesses 43 are formed in volumes from which the sacrificial material layers 42 are removed.

The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective electrode layer of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 12B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the front-side blocking dielectric layer 52 is present within each memory opening, the backside blocking dielectric layer 44 is optional. In case the front-side blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 12C, a metallic barrier layer 46A and a ferroelectric material layer 46B can be sequentially deposited in the backside recesses 43 and at a peripheral region of each backside trench 79. The metallic barrier layer 46A includes an electrically conductive metallic material that can function as a diffusion barrier layer and/or adhesion promotion layer for materials to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

The ferroelectric material layer 46B can be deposited directly on physically exposed surfaces of the metallic barrier layer 46A. The ferroelectric material layer 46B includes a ferroelectric material. As used herein, a "ferroelectric material" refers to a crystalline material that exhibits spontaneous electrical polarization in the absence of an external electric field. The ferroelectric material in the ferroelectric material layer 46B may be an insulating ferroelectric material or a semiconducting ferroelectric material. In one embodiment, the ferroelectric material layer 46B comprises an orthorhombic phase hafnium oxide layer including at least one dopant selected from Al, Zr, or Si. Other suitable ferroelectric materials may also be used, as such as titanate ferroelectric materials (e.g., barium titanate, lead titanate, lead zirconate titanate, lead lanthanum zirconate titanate ("PLZT"), etc.). In one embodiment, the ferroelectric material layer 46B has a thickness in a range from 2 nm to 25 nm, such as from 15 nm to 25 nm, although lesser and greater thicknesses can also be employed. In one embodiment, the ferroelectric material layer 46B can be deposited by a conformal deposition process such as chemical vapor deposition (CVD) or atomic layer deposition (ALD).

Figure 13:
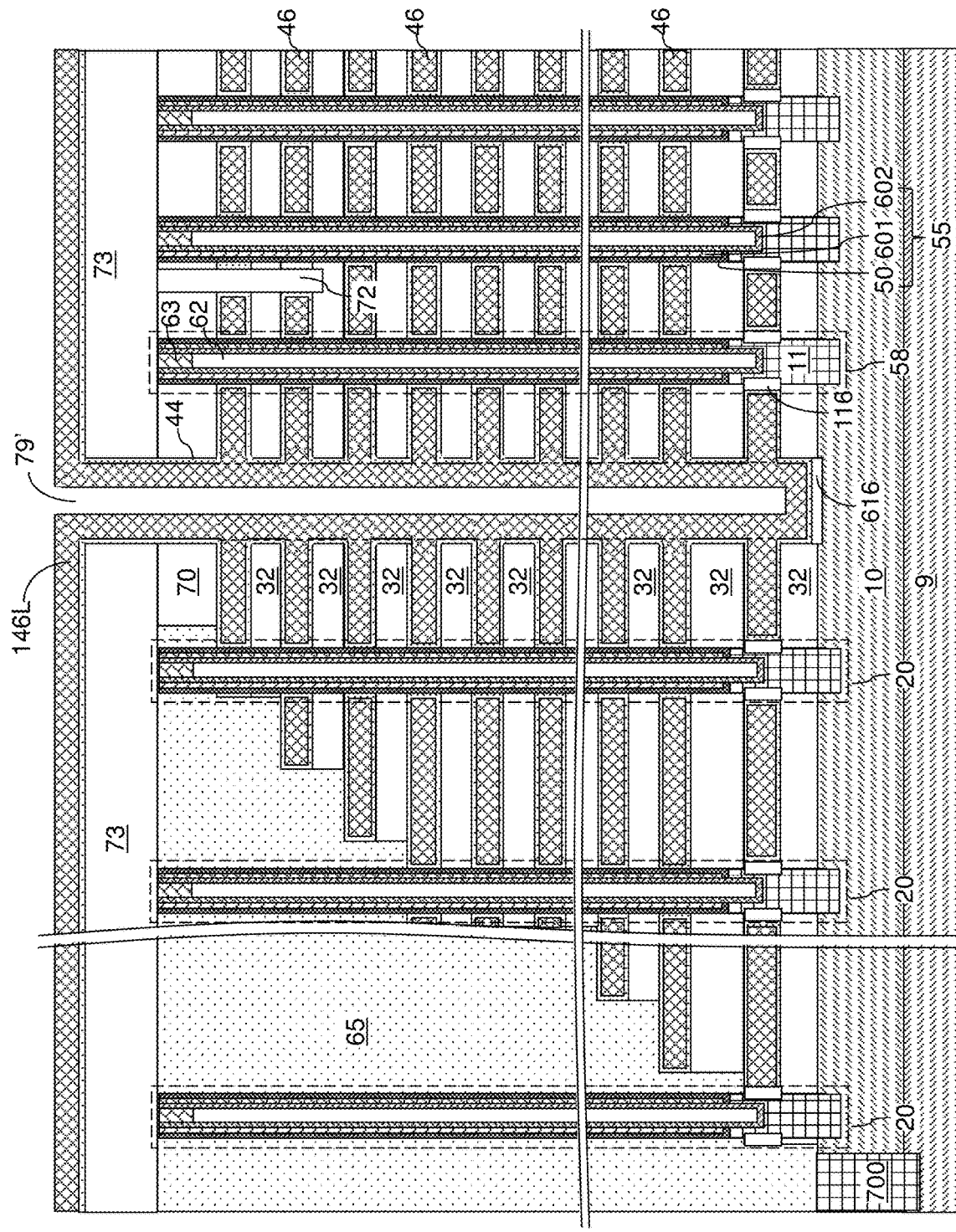
FIG. 13 is a schematic vertical cross-sectional view of the exemplary structure at the processing step of FIG. 12D.
Figure 14B:
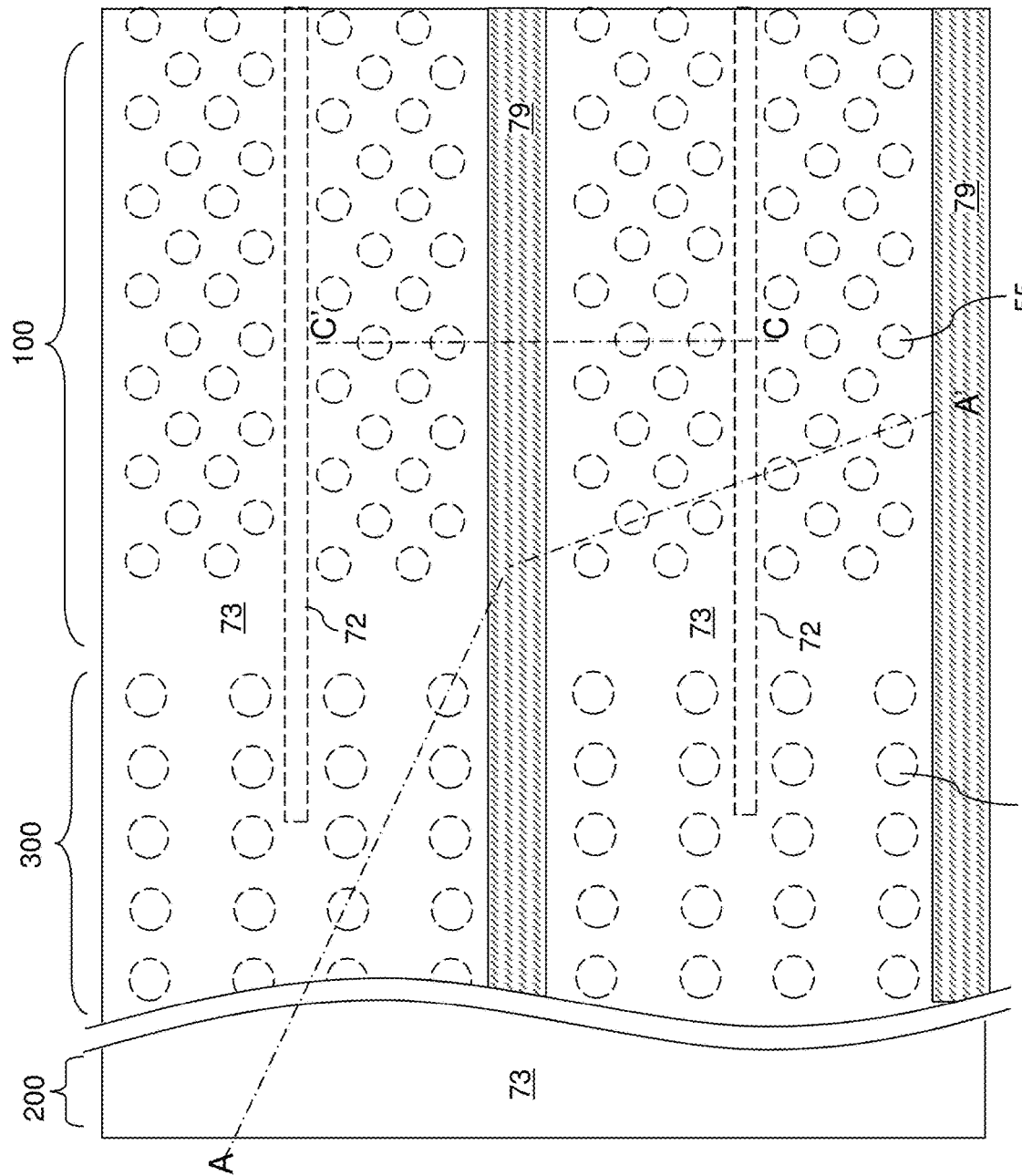
FIG. 14B is a partial see-through top-down view of the exemplary structure of FIG. 14A. The vertical plane A-A' is the plane of the schematic vertical cross-sectional view of FIG. 14A.
Figure 14C:
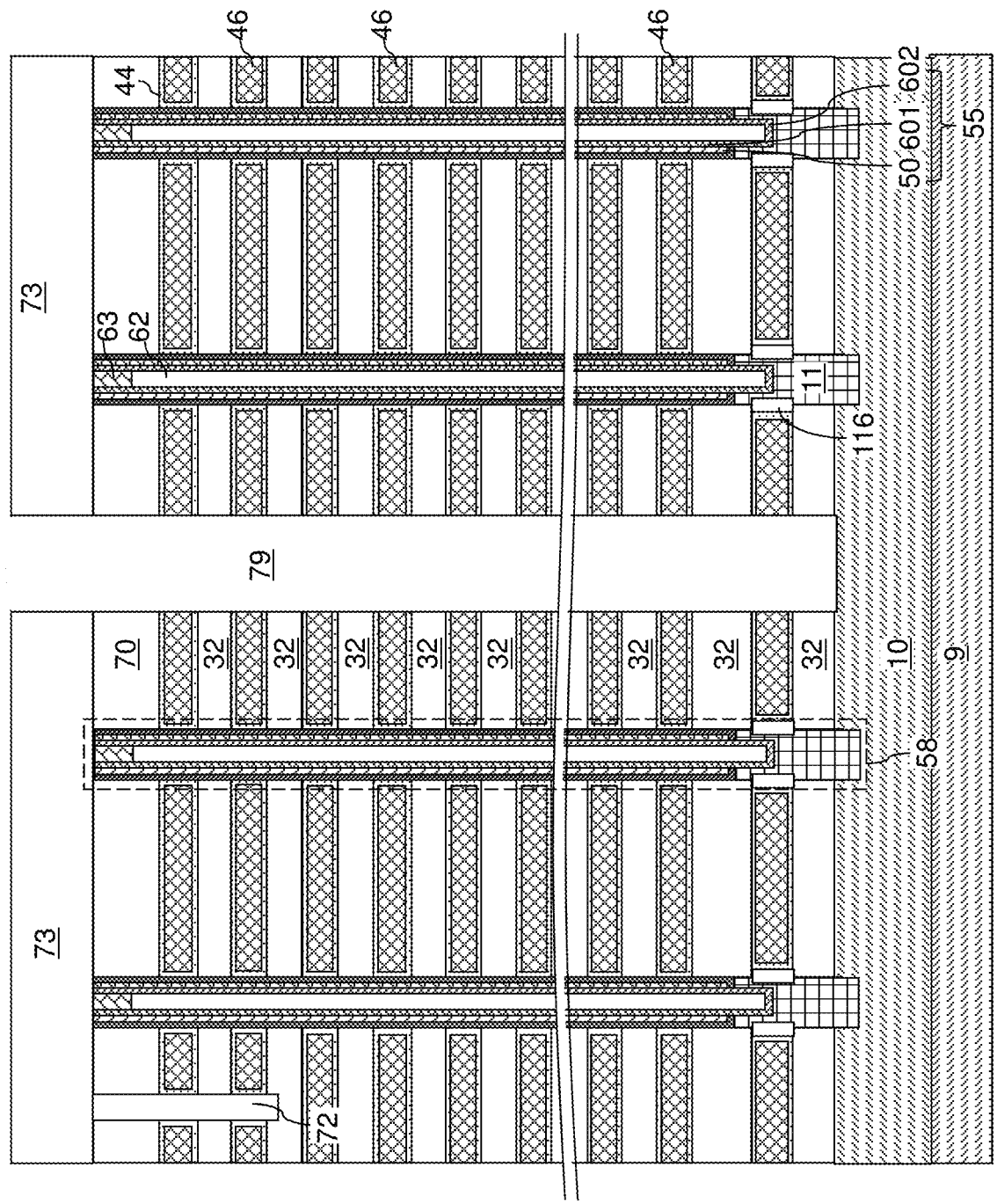
FIG. 14C is a vertical cross-sectional view of the exemplary structure along the vertical plane C-C' of FIG. 14B.
Figure 14D:
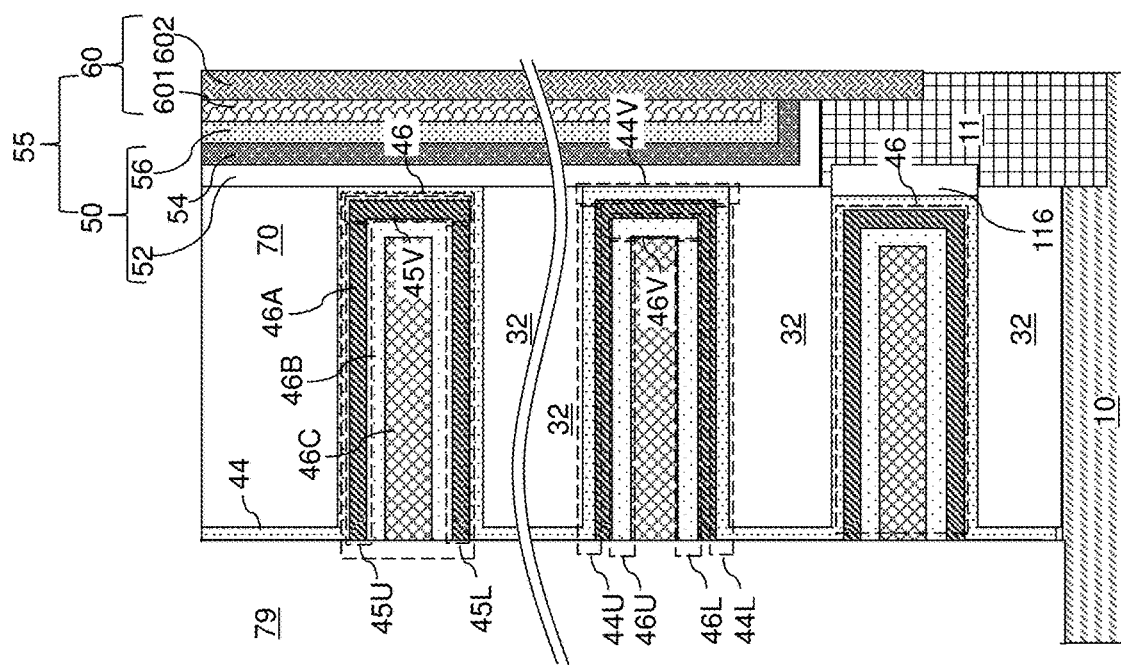
FIG. 14D is a magnified view of a region of the exemplary structure of FIGS. 14A-14C.

Referring to FIGS. 12D and 13, a metal fill material is deposited directly on the physically exposed surfaces of the ferroelectric material layer 46B. The metallic fill material is deposited in remaining volumes of the plurality of backside recesses 43, at a peripheral region of the backside trenches 79 over the sidewalls of the backside trenches 79, and over the top surface of the contact level dielectric layer 73 to form a metallic fill material layer 46C. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46C can consist essentially of at least one elemental metal. The at least one elemental metal of the metallic fill material layer 46C can be selected, for example, from tungsten, cobalt, ruthenium, titanium, and tantalum. In one embodiment, the metallic fill material layer 46C can consist essentially of a single elemental metal. In one embodiment, the metallic fill material layer 46C can be deposited employing a fluorine-containing precursor gas such as $WF_6$. In one embodiment, the metallic fill material layer 46C can be a tungsten layer including a residual level of fluorine atoms as impurities. The metallic fill material layer 46C is spaced from the insulating layers 32 and the memory stack structures 55 by the metallic barrier layer 46A and the ferroelectric material layer 46B.

A plurality of electrode layers 46 can be formed in the plurality of backside recesses 43, and a continuous electrically conductive material layer 146L can be formed on the sidewalls of each backside trench 79 and over the contact level dielectric layer 73. Each electrode layer 46 includes a portion of the metallic barrier layer 46A, a portion of the ferroelectric material layer 46B, and a portion of the metallic fill material layer 46C that are located between a vertically neighboring pair of dielectric material layers such as a pair of insulating layers 32. The continuous electrically conductive material layer 146L includes a continuous portion of the metallic barrier layer 46A, a continuous portion of the ferroelectric material layer 46B, and a continuous portion of the metallic fill material layer 46C that are located in the backside trenches 79 or above the contact level dielectric layer 73.

Each sacrificial material layer 42 can be replaced with an electrode layer 46. A backside cavity 79' is present in the portion of each backside trench 79 that is not filled with the backside blocking dielectric layer 44 and the continuous electrically conductive material layer 146L. A tubular dielectric spacer 116 laterally surrounds a pedestal channel portion 11. A bottommost electrode layer 46 laterally surrounds each tubular dielectric spacer 116 upon formation of the electrode layers 46.

Referring to FIGS. 14A-14D, the deposited metallic material of the continuous electrically conductive material layer 146L is etched back from the sidewalls of each backside trench 79 and from above the contact level dielectric layer 73, for example, by an isotropic wet etch, an anisotropic dry etch, or a combination thereof. Portions of the metallic barrier layer 46A, the ferroelectric material layer 46B, and the metallic fill material layer 46C located within the backside trenches 79 are removed. The remaining portions of the metallic barrier layer 46A, the ferroelectric material layer 46B, and the metallic fill material layer 46C in the backside recesses 43 constitute electrode layers 46. Each contiguous set of material portions of the deposited metallic material in the backside recesses 43 constitutes an electrode layer 46. Each electrode layer 46 can be a conductive line structure. Thus, the sacrificial material layers 42 are replaced with the electrode layers 46.

The electrode layers 46 comprise word lines of the three-dimensional array device of the present disclosure. Each word line, as embodied as a respective one of the electrode layers 46, comprises a layer stack including a metallic barrier layer 46A comprising a first metallic material, a ferroelectric material layer 46B in contact with the metallic barrier layer 46A, and a metallic fill material layer 46C comprising a second metallic material, contacting the ferroelectric material layer 46B, and is spaced from the metallic barrier layer 46A by the ferroelectric material layer 46B.

At least one blocking dielectric layer (52, 44) is located between each neighboring pair of a respective one of the charge storage elements and a respective one of the word lines. In one embodiment, the at least one blocking dielectric layer (52, 44) comprises a front-side blocking dielectric layer 52 located within the memory film 50 and contacting the charge storage layer 54. Additionally or alternatively, the at least one blocking dielectric layer (52, 44) comprises a backside blocking dielectric layer 44 including an upper horizontal backside blocking dielectric layer portion 44U located between the respective one of the word lines and an overlying one of the insulating layers 32, a lower horizontal backside blocking dielectric layer portion 44L located between the respective one of the word lines and an underlying one of the insulating layers 32, and vertical backside blocking dielectric layer portion 44V laterally surrounding a respective one of the memory films 50, laterally surrounded by the respective one of the word lines, and vertically extending between the upper horizontal backside blocking dielectric layer portion 44U and the lower horizontal backside blocking dielectric layer portion 44L.

In one embodiment, the ferroelectric material layer 46B within each electrode layer 46 comprises an upper horizontal ferroelectric material portion 46U that overlies the metallic fill material layer 46C, a lower horizontal ferroelectric material portion 46L that underlies the metallic fill material layer 46C, and a vertical ferroelectric material portion 46V that vertically extends between an edge of the upper horizontal ferroelectric material portion 46U and an edge of the lower horizontal ferroelectric material portion 46L and contacting a sidewall of the metallic fill material layer 46C.

In one embodiment, the metallic barrier layer 46A within each electrode layer 46 comprises an upper horizontal metallic barrier layer portion 45U overlying the upper horizontal ferroelectric material portion 46U, a lower horizontal metallic barrier layer portion 45L underlying the lower horizontal ferroelectric material portion 46L, and a vertical metallic barrier layer portion 45V that vertically extends between the upper horizontal metallic barrier layer portion 45U and the lower horizontal metallic barrier layer portion 45L.

A subset of the electrode layer 46 can function as word lines of a three-dimensional memory array of the present disclosure. The plurality of control gate electrodes within each electrode layer 46 are the control gate electrodes for the vertical memory devices including the memory stack structures 55. In other words, each electrode layer 46 can be a word line that functions as a common control gate electrode for the plurality of vertical memory devices.

In one embodiment, the removal of the continuous electrically conductive material layer 146L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 146L may not be selective to the material of the backside blocking dielectric layer 44 or, the backside blocking dielectric layer 44 may not be employed. The planar dielectric portions 616 can be removed during removal of the continuous electrically conductive material layer 146L. A backside cavity 79' is present within each backside trench 79.

Figure 15A:
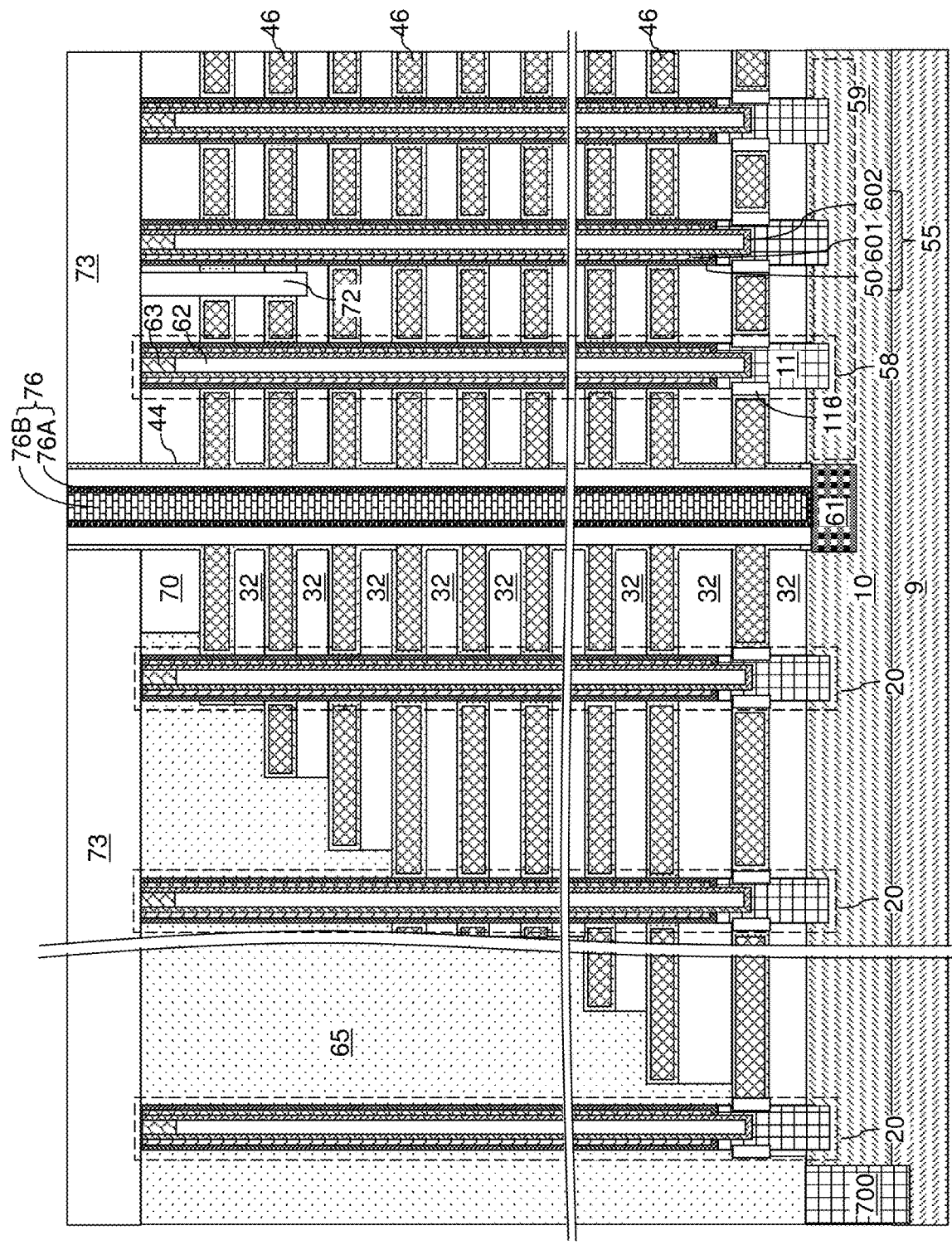
FIG. 15A is a schematic vertical cross-sectional view of the exemplary structure after formation of an insulating spacer and a backside contact structure within each backside trench according to an embodiment of the present disclosure.
Figure 15B:
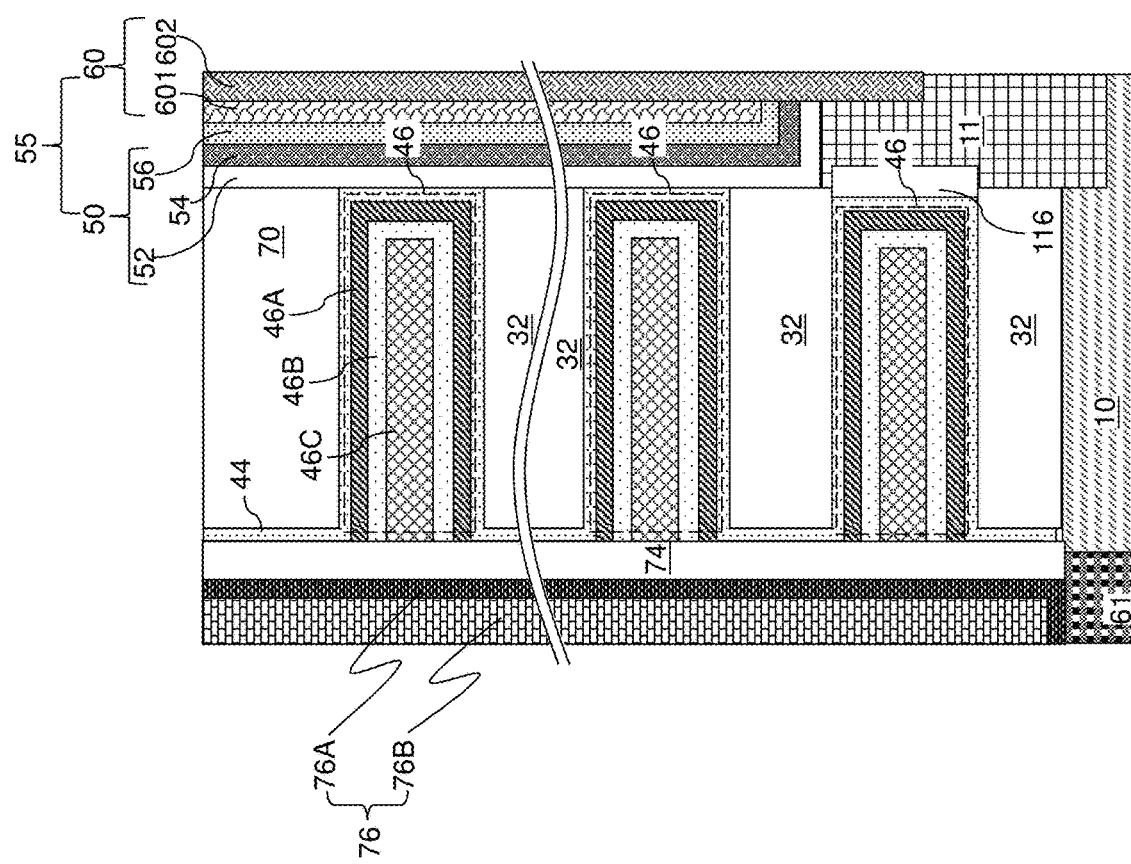
FIG. 15B is a magnified view of a region of the exemplary structure of FIG. 15A.

Referring to FIGS. 15A and 15B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrode layers 46. If a backside blocking dielectric layer 44 is not employed, the insulating material layer can be formed directly on sidewalls of the insulating layers 32 and directly on sidewalls of the electrode layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74. Generally, a source region 61 having a doping of the second conductivity type can be formed in, on, or over the substrate (9, 10). The source region 61 is electrically connected to a bottom end of each of the vertical semiconductor channels 60.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrode layer 46 provided upon formation of the electrode layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 16A:
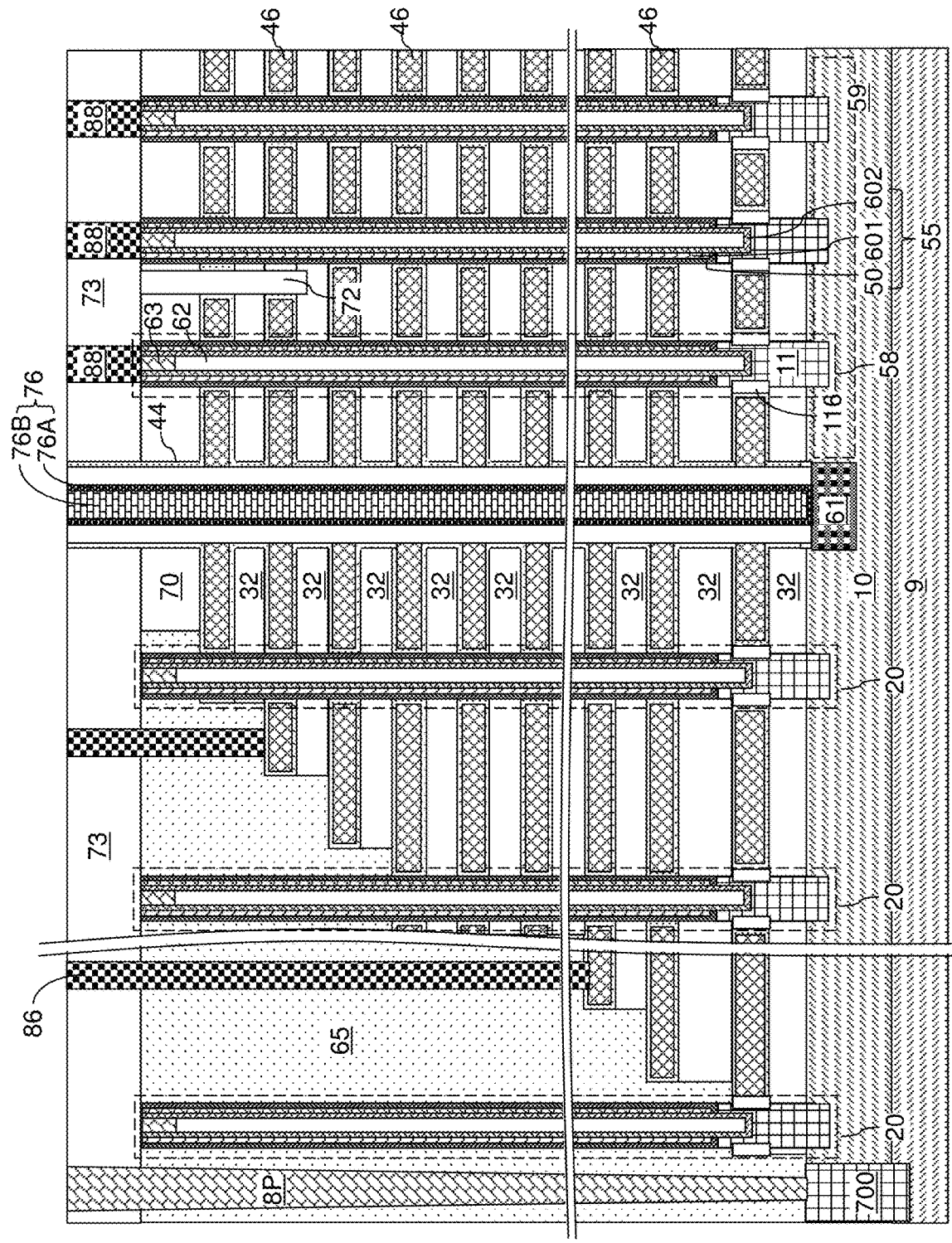
FIG. 16A is a schematic vertical cross-sectional view of the exemplary structure after formation of additional contact via structures according to an embodiment of the present disclosure.
Figure 16B:
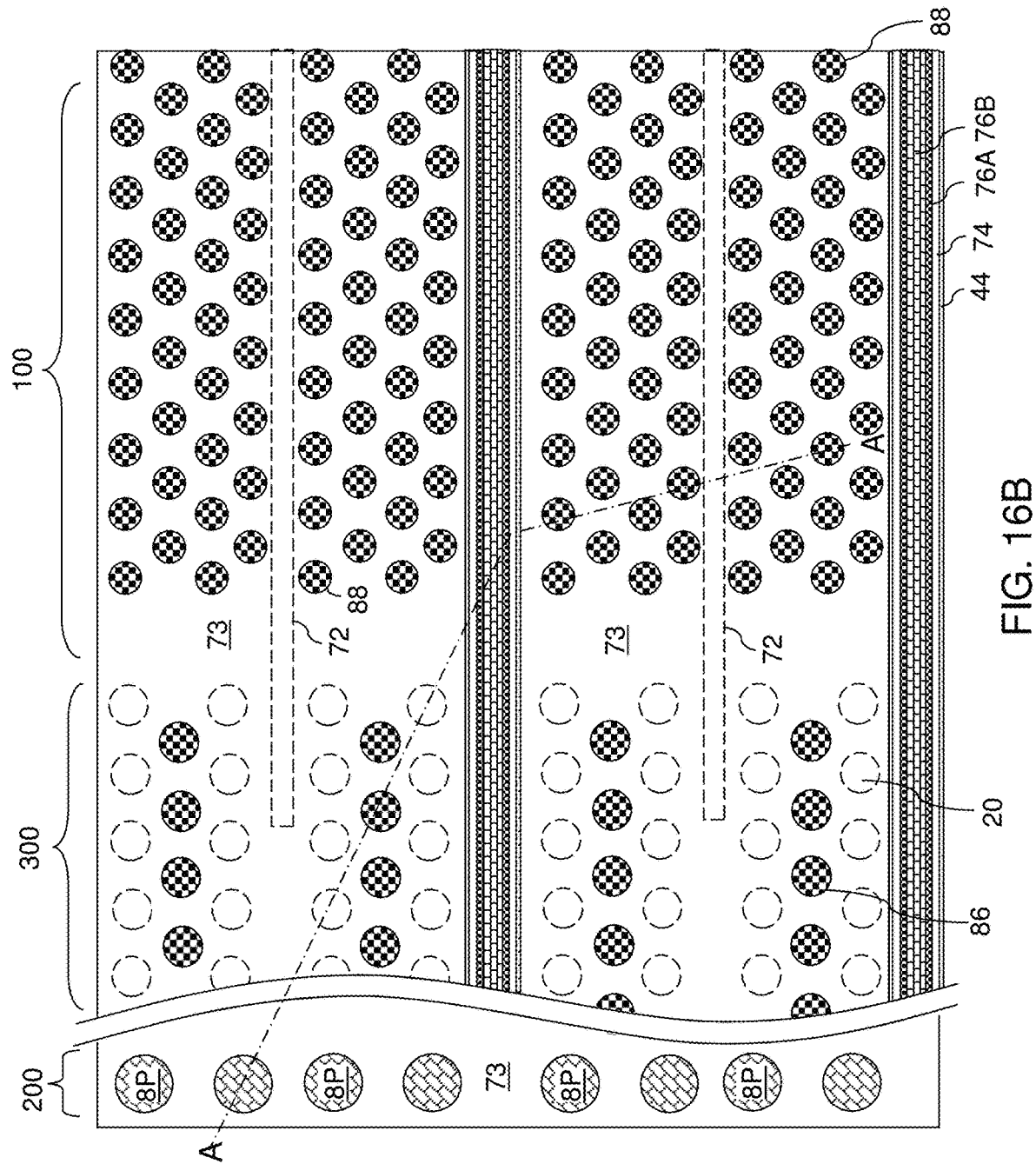
FIG. 16B is a top-down view of the exemplary structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrode layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

In one alternative configuration of the device of the first embodiment, the at least one semiconductor device 700 may be located under the memory array region 100 and/or under the staircase region 300 as described in U.S. Pat. No. 9,806,093 B2, issued on Oct. 31, 2017 and incorporated herein by reference in its entirety, in addition to or instead of being located on the side of the staircase region 300, as shown in FIG. 5.

In another alternative configuration of the device of the first embodiment, the at least one semiconductor device 700 may be located over the memory array region 100 and/or over the staircase region 300 as described in U.S. patent application Ser. No. 15/873,101, filed on Jan. 17, 2018 and incorporated herein by reference in its entirety. For example, the at least one semiconductor device 700 may be formed on a separate substrate and then bonded over the memory array region and/or over the staircase region 300 by any suitable bonding technique.

In another alternative configuration of the device of the first embodiment, instead of forming the source region 61 in the semiconductor substrate (9, 10) as shown in FIG. 15A, a horizontal source electrode (e.g., a semiconductor direct source strap contact) can be formed to a side of the semiconductor channel 60, as described in U.S. Pat. No. 10,199,351 B1, issued on Feb. 5, 2019, and incorporated herein by reference in its entirety.

Figure 17:
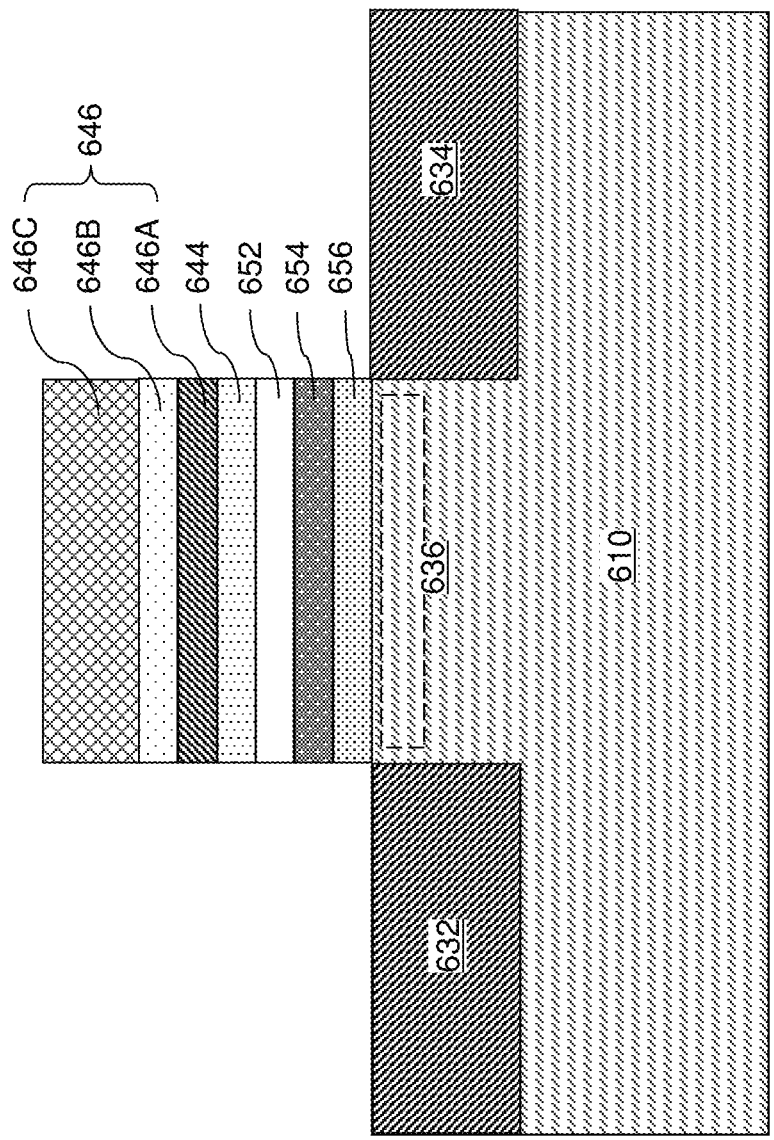
FIGS. 17 and 18 are vertical cross-sectional view of two-dimensional memory devices according to a second embodiment of the present disclosure.
Figure 18:
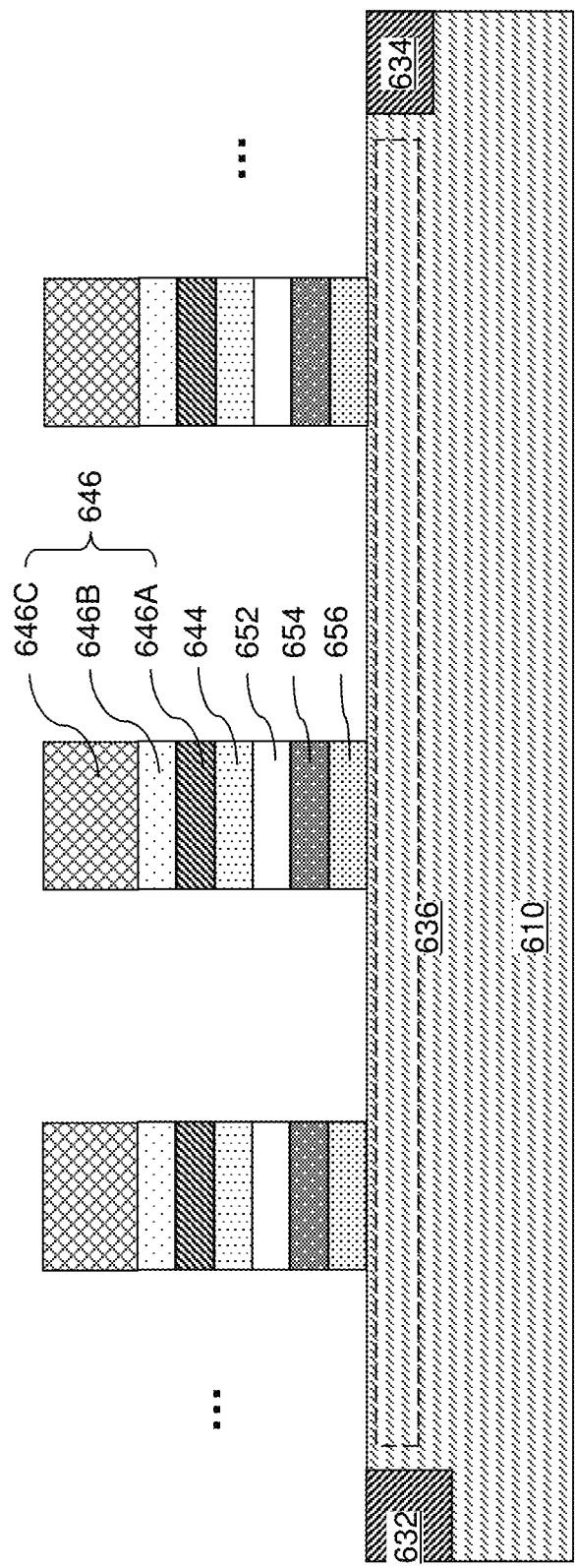

Referring to FIGS. 17 and 18, semiconductor structures according to a second embodiment of the present disclosure are illustrated. The semiconductor structure comprises a two-dimensional charge storage device, such as a two-dimensional charge storage field effect transistor shown in FIG. 17 or a two-dimensional NAND string shown in FIG. 18 which contains plural control gate electrodes and plural charge storage elements between the common semiconductor channel and the control gate electrodes. The select gate electrodes which typically do not overly the charge storage element(s) are not shown in FIG. 18 for clarity. The control gate electrode(s) 646 of the field effect transistor or NAND string includes a ferroelectric material layer 646B between two control gate electrode electrically conductive layers 646A and 646C. For example, the control gate electrode(s) 646 includes a layer stack that contains, from bottom to top, a metallic barrier layer 646A comprising a first metallic material, a ferroelectric material layer 646B in contact with the metallic barrier layer 646A, and a metallic material layer 646C comprising a second metallic material, contacting the ferroelectric material layer 646B, and is spaced from the metallic barrier layer 646A by the ferroelectric material layer 646B. The metallic barrier layer 646A can have the same composition as, and the same thickness as, the metallic barrier layer 46A described above. The ferroelectric material layer 646B can have the same composition as, and the same thickness as, the ferroelectric material layer 46B described above. The metallic material layer 646C can have the same composition as the metallic fill material layer 46C described above. The thickness of the metallic material layer 646C can be in a range from 20 nm to 200 nm, although lesser and greater thicknesses can also be employed.

The semiconductor structure can comprise a semiconductor layer 610 having a doping of a first conductivity type, and a first active region 632 and a second active region 634 that have a doping of a second conductivity type and laterally spaced apart from each other by a semiconductor channel 636 that is a portion of the semiconductor layer 610. One of the first active region 632 and the second active region 634 can be a source region, and another of the first active region 632 and the second active region 634 can be a drain region.

A tunneling dielectric layer 656 can contact a top surface of the semiconductor channel 636. The tunneling dielectric layer 656 can have the same composition as, and the same thickness as, the tunneling dielectric layer 56 described above. A charge storage layer 654 can contact a top surface of the tunneling dielectric layer 656. The charge storage layer 654 can have the same composition as, and the same thickness as, the charge storage layer 54 described above. At least one blocking dielectric layer (652, 644) can contact the charge storage layer 654. The at least one blocking dielectric layer (652, 644) can include at least one of a first blocking dielectric layer 652 and a second blocking dielectric layer 644. The first blocking dielectric layer 652 can have the same composition as, and the same thickness as, the front-side blocking dielectric layer 52. The second blocking dielectric layer 644 can have the same composition as, and the same thickness as, the backside blocking dielectric layer 44.

In one embodiment, the ferroelectric material layer 646B comprises an orthorhombic phase hafnium oxide layer including at least one dopant selected from Al, Zr, and Si and having a thickness in a range from 2 nm to 25 nm. However, other ferroelectric materials described in the first embodiment may also be used. In one embodiment, the metallic barrier layer 646A comprises a conductive metallic nitride layer, such as TiN, and the metallic material layer 646C consists essentially of an elemental metal, such as tungsten.

The semiconductor structures of FIGS. 17 and 18 can be formed by forming a layer stack including, from bottom to top, a layer including the material of the tunneling dielectric layer 656, a layer including the material of the charge storage layer 654, a layer including the material of the first blocking dielectric layer 652, a layer including the material of the second blocking dielectric layer 644, a layer including the material of the metallic barrier layer 646A, a layer including the material of the ferroelectric material layer 646B, and a layer including the material of the metallic material layer 646C over a top surface of the semiconductor layer 610, by patterning the layer stack into control gate electrode(s) by a combination of a lithographic patterning step and an anisotropic etch step, and by implanting dopants of the second conductivity type into upper portions of the semiconductor layer 610 to convert surface portions of the semiconductor layer 610 into the first active region 632 and the second active region 634. The switching characteristics of the devices of FIGS. 17 and 18 can be enhanced by placing the control gate electrode in a pre-charged condition PCC and by taking advantage of capacitance reduction due to the negative capacitance phenomenon induced in the control gate electrode during reading or programming of the memory device.

Referring collectively to FIGS. 1-18 according to various embodiments of the present disclosure, a memory device includes a channel (60, 636), a control gate electrode (46, 646), and at least one charge storage element (54, 654) located between the channel and the control gat electrode. The control gate electrode includes a first electrically conductive layer (46A, 646A), a second electrically conductive layer (46C, 646C) and a ferroelectric material layer (46B, 646B) located between the first electrically conductive layer and the second electrically conductive layer.

Referring collectively to FIGS. 1-16B and according to various embodiments of the present disclosure, a three-dimensional memory device is provided, which comprises: an alternating stack of insulating layers 32 and control gate electrode layers 46 located over a substrate (9, 10); and memory stack structures 55 located within memory openings 49 that extend through the alternating stack (32, 46), wherein each of the memory stack structures 55 comprises a memory film 50 and a vertical semiconductor channel 60 contacting the memory film 50, wherein each of the control gate electrode layers 46 comprises a layer stack including a metallic barrier layer 46A comprising a first metallic material, a ferroelectric material layer 46B in contact with the metallic barrier layer 46A, and a metallic fill material layer 46C comprising a second metallic material, contacting the ferroelectric material layer 46B, and is spaced from the metallic barrier layer 46A by the ferroelectric material layer 46B.

In one embodiment, the memory film 50 comprises a tunneling dielectric layer 56 and charge storage elements including a charge storage material portion and located levels of the control gate electrode layers 46. In one embodiment, the memory film 50 comprises a charge storage layer 54 including a continuous layer of a charge storage material that vertically extends through multiple levels of the control gate electrode layers 46, wherein the charge storage material portions comprise portions of the charge storage material located at levels of the control gate electrode layers 46.

In one embodiment, at least one blocking dielectric layer (52, 44) is located between each neighboring pair of a respective one of the charge storage elements and a respective one of the control gate electrode layers 46. In one embodiment, the at least one blocking dielectric layer (52, 44) comprises a front-side blocking dielectric layer 52 located within the memory film 50 and contacting the charge storage layer 54.

In one embodiment, the ferroelectric material layer 46B comprises a hafnium oxide layer including at least one dopant selected from Al, Zr, and Si and having a thickness in a range from 3 nm to 25 nm. In one embodiment, the metallic barrier layer 46A comprises a conductive metallic nitride layer; and the metallic fill material layer 46C consists essentially of an elemental metal.

In one embodiment, the vertical semiconductor channel 60 comprises a semiconductor material having a doping of a first conductivity type; a drain region 63 having a doping of a second conductivity type is located at a top end of the vertical semiconductor channel 60; and a source region 61 having a doping of the second conductivity type is electrically connected to a bottom end of the vertical semiconductor channel 60.

In one embodiment, the alternating stack (32, 46) comprises a terrace region in which each control gate electrode layer 46 other than a topmost one of the control gate electrode layers 46 within the alternating stack laterally extends farther than any overlying control gate electrode layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

In one embodiment, the three-dimensional memory device comprises a monolithic three-dimensional NAND memory device; and the control gate electrode layers 46 and the memory stack structures 55 comprise a two-dimensional array of vertical NAND strings.

In the second embodiment, the memory device comprises a two-dimensional charge storage transistor, as shown in FIG. 17 or a two-dimensional NAND memory string, as shown in FIG. 18.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
    a channel;
    a control gate electrode; and
    at least one charge storage element located between the channel and the control gate electrode;
    wherein the control gate electrode comprises a first electrically conductive layer, a second electrically conductive layer and a ferroelectric material layer located between the first electrically conductive layer and the second electrically conductive layer.

2. The memory device of claim 1, wherein the ferroelectric material layer comprises an orthorhombic phase hafnium oxide layer including at least one dopant selected from Al, Zr, or Si and having a thickness in a range from 2 nm to 25 nm.

3. The memory device of claim 1, wherein the memory device comprises a three-dimensional memory device, comprising:
    an alternating stack of insulating layers and the control gate electrode layers located over a substrate; and
    memory stack structures located within memory openings that extend through the alternating stack, wherein each of the memory stack structures comprises a memory film containing the at least one charge storage element and a vertical semiconductor channel contacting the memory film,
    wherein each of the control gate electrode layers comprises a layer stack including the first electrically conductive layer comprising a metallic barrier layer, the ferroelectric material layer in contact with the metallic barrier layer, and the second electrically conductive layer comprising a metallic fill material layer contacting the ferroelectric material layer, and spaced from the metallic barrier layer by the ferroelectric material layer.

4. The memory device of claim 3, wherein the ferroelectric material layer comprises an upper horizontal ferroelectric material portion that overlies the metallic fill material layer, a lower horizontal ferroelectric material portion that underlies the metallic fill material layer, and a vertical ferroelectric material portion that vertically extends between an edge of the upper horizontal ferroelectric material portion and an edge of the lower horizontal ferroelectric material portion and contacting a sidewall of the metallic fill material layer.

5. The memory device of claim 4, wherein the metallic barrier layer comprises an upper horizontal metallic barrier layer portion overlying the upper horizontal ferroelectric material portion, a lower horizontal metallic barrier layer portion underlying the lower horizontal ferroelectric material portion, and a vertical metallic barrier layer portion that vertically extends between the upper horizontal metallic barrier layer portion and the lower horizontal metallic barrier layer portion.

6. The memory device of claim 3, wherein the memory film comprises a tunneling dielectric layer, at least one blocking dielectric layer and the at least one charge storage element which comprises a continuous layer of a charge storage material that vertically extends through multiple levels of the control gate electrode layers.

7. The memory device of claim 6, wherein the at least one blocking dielectric layer comprises a front-side blocking dielectric layer located within the memory film and contacting the charge storage layer.

8. The memory device of claim 7, wherein the at least one blocking dielectric layer further comprises a backside blocking dielectric layer including an upper horizontal backside blocking dielectric layer portion located between the respective one of the control gate electrode layers and an overlying one of the insulating layers, a lower horizontal backside blocking dielectric layer portion located between the respective one of the control gate electrode layers and an underlying one of the insulating layers, and vertical backside blocking dielectric layer portion laterally surrounding a respective one of the memory films, laterally surrounded by the respective one of the control gate electrode layers, and vertically extending between the upper horizontal backside blocking dielectric layer portion and the lower horizontal backside blocking dielectric layer portion.

9. The memory device of claim 3, wherein:
    the ferroelectric material layer comprises a hafnium oxide layer including at least one dopant selected from Al, Zr, and Si and having a thickness in a range from 3 nm to 25 nm;
    the metallic barrier layer comprises a conductive metallic nitride layer; and
    the metallic fill material layer consists essentially of an elemental metal.

10. The memory device of claim 3, wherein:
    the vertical semiconductor channel comprises a semiconductor material having a doping of a first conductivity type;
    a drain region having a doping of a second conductivity type is located at a top end of the vertical semiconductor channel;
    a source region having a doping of the second conductivity type is electrically connected to a bottom end of the vertical semiconductor channel;
    the alternating stack comprises a terrace region in which each control gate electrode layer other than a topmost one of the control gate electrode layers within the alternating stack laterally extends farther than any overlying control gate electrode layer within the alternating stack;
    the terrace region includes stepped surfaces of the alternating stack that continuously extend from a bottommost layer within the alternating stack to a topmost layer within the alternating stack; and support pillar structures extend through the stepped surfaces and through a retro-stepped dielectric material portion that overlies the stepped surfaces.

11. The memory device of claim 3, wherein:
the three-dimensional memory device comprises a monolithic three-dimensional NAND memory device; and
the control gate electrode layers and the memory stack structures comprise a two-dimensional array of vertical NAND strings.

12. The memory device of claim 1, wherein the memory device comprises a two-dimensional charge storage transistor.

13. The memory device of claim 1, wherein the memory device comprises a two-dimensional NAND memory string.

14. A method of forming a three-dimensional memory device, comprising:
forming an alternating stack of insulating layers and sacrificial material layers over a substrate;
forming memory openings through the alternating stack;
forming memory stack structures located within a memory opening that extends through the alternating stack, wherein each of the memory stack structures comprises a memory film and a vertical semiconductor channel contacting the memory film; and
replacing the sacrificial material layers with electrode layers, wherein each of the electrode layers comprises a layer stack including a metallic barrier layer comprising a first metallic material, a ferroelectric material layer in contact with the metallic barrier layer, and a metallic fill material layer comprising a second metallic material, contacting the ferroelectric material layer, and is spaced from the metallic barrier layer by the ferroelectric material layer;
wherein each of the memory films comprises:
a charge storage layer deposited over a sidewall of a respective one of the memory openings; and
a tunneling dielectric layer deposited on the charge storage layer, wherein one of the vertical semiconductor channels is formed on the tunneling dielectric layer.

15. The method of claim 14, further comprising:
forming a backside trench through the alternating stack after formation of the memory stack structures; and
etching the sacrificial material layers selective to the insulating layers and the memory stack structures by providing an isotropic etchant into the backside trenches, wherein the electrode layers are formed in volumes of the backside recesses.

16. The method of claim 15, further comprising:
sequentially depositing a metallic barrier layer, a ferroelectric material layer, and a metallic fill material layer in the backside recesses and at a peripheral region of the backside trench; and
removing portions of the metallic barrier layer, the ferroelectric material layer, and the metallic fill material layer located within the backside trench, wherein remaining portions of the metallic barrier layer, the ferroelectric material layer, and the metallic fill material layer in the backside recesses constitute the electrode layers.

17. The method of claim 14, wherein the ferroelectric material layer comprises a hafnium oxide layer including at least one dopant selected from Al, Zr, and Si and having a thickness in a range from 3 nm to 25 nm.

18. The method of claim 17, wherein:
the metallic barrier layer comprises a conductive metallic nitride layer; and
the metallic fill material layer consists essentially of an elemental metal.

19. The method of claim 14, wherein:
the vertical semiconductor channel comprises a semiconductor material having a doping of a first conductivity type; and
the method further comprises:
forming a drain region having a doping of a second conductivity type at each top end of the vertical semiconductor channels; and
forming a source region having a doping of the second conductivity type in, on, or over the substrate, wherein the source region is electrically connected to a bottom end of each of the vertical semiconductor channels.

20. A method of forming a three-dimensional memory device, comprising:
forming an alternating stack of insulating layers and sacrificial material layers over a substrate;
forming memory openings through the alternating stack;
forming memory stack structures located within a memory opening that extends through the alternating stack, wherein each of the memory stack structures comprises a memory film and a vertical semiconductor channel contacting the memory film, wherein the vertical semiconductor channel comprises a semiconductor material having a doping of a first conductivity type;
forming a drain region having a doping of a second conductivity type at each top end of the vertical semiconductor channels; and
replacing the sacrificial material layers with electrode layers, wherein each of the electrode layers comprises a layer stack including a metallic barrier layer comprising a first metallic material, a ferroelectric material layer in contact with the metallic barrier layer, and a metallic fill material layer comprising a second metallic material, contacting the ferroelectric material layer, and is spaced from the metallic barrier layer by the ferroelectric material layer; and
forming a source region having a doping of the second conductivity type in, on, or over the substrate, wherein the source region is electrically connected to a bottom end of each of the vertical semiconductor channels.

* * * * *